(12) United States Patent
Saha et al.

(10) Patent No.: US 10,503,853 B1
(45) Date of Patent: Dec. 10, 2019

(54) FORMAL VERIFICATION USING CACHED SEARCH PATH INFORMATION TO VERIFY PREVIOUSLY PROVED/DISPROVED PROPERTIES

(71) Applicant: Synopsys, Inc., Mountain View, CA (US)

(72) Inventors: Arunava Saha, Sunnyvale, CA (US); Himanshu Jain, Portland, OR (US); Manish Pandey, Saratoga, CA (US); Ashvin Dsouza, Carlisle, MA (US); Per Mattias Bjesse, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/048,063

(22) Filed: Jul. 27, 2018

Related U.S. Application Data

(60) Provisional application No. 62/538,196, filed on Jul. 28, 2017.

(51) Int. Cl.
*G06F 9/455* (2018.01)
*G06F 17/50* (2006.01)

(52) U.S. Cl.
CPC ........ *G06F 17/504* (2013.01); *G06F 17/5045* (2013.01)

(58) Field of Classification Search
USPC ................................ 716/102, 104, 106, 108
See application file for complete search history.

(56) References Cited

U.S. PATENT DOCUMENTS

| 8,042,078 | B2 | 10/2011 | Paruthi et al. |
| 8,996,339 | B2 | 3/2015 | Chockler et al. |
| 9,449,196 | B1 * | 9/2016 | Purri ................... G06F 17/5022 |

(Continued)

OTHER PUBLICATIONS

Chockler, Hana et al., article entitled "Incremental Formal Verification of Hardware", published 2011 in 2011, Formal Methods in Computer-Aided Design, 9 pages.

*Primary Examiner* — Brian Ngo
(74) *Attorney, Agent, or Firm* — Bever, Hoffman & Harms, LLP

(57) ABSTRACT

A formal verification tool that verifies multiple sequentially-generated versions of a core circuit design by obtaining search path information from the formal verification solver for each property that is proven or disproven during a first formal verification session involving an earlier-generated circuit design version, and utilizing the search path information to perform search-path verification processes during a subsequent formal verification session to quickly verify the proven/disproven properties in a later-generated circuit design version. Each property's search path information includes counterexample traces or proof artifacts identifying the search operations utilized to achieve a corresponding counterexample or proof object that proves/disproves the property. Search-path verification involves applying the stored search path information to the later-generated circuit design version, and determining if the same counterexample or proof object is achieved. The stored search path information is also utilized to perform efficient path-influenced search processes when the search-path verification process fails.

20 Claims, 11 Drawing Sheets

(56) References Cited

U.S. PATENT DOCUMENTS

| | | | |
|---|---|---|---|
| 2002/0144218 A1* | 10/2002 | Levin | G06F 17/504 |
| | | | 716/107 |
| 2004/0177332 A1 | 9/2004 | Pandey et al. | |
| 2005/0188337 A1* | 8/2005 | Baumgartner | G06F 17/5022 |
| | | | 716/107 |
| 2007/0299648 A1 | 12/2007 | Levitt et al. | |
| 2012/0054701 A1* | 3/2012 | Baumgartner | G06F 17/504 |
| | | | 716/106 |
| 2013/0290918 A1* | 10/2013 | Baumgartner | G06F 17/505 |
| | | | 716/104 |
| 2015/0213167 A1* | 7/2015 | Jain | G06F 17/5081 |
| | | | 716/106 |
| 2016/0124827 A1* | 5/2016 | Manoj Gangadhar | |
| | | | G06F 11/263 |
| | | | 702/182 |

\* cited by examiner

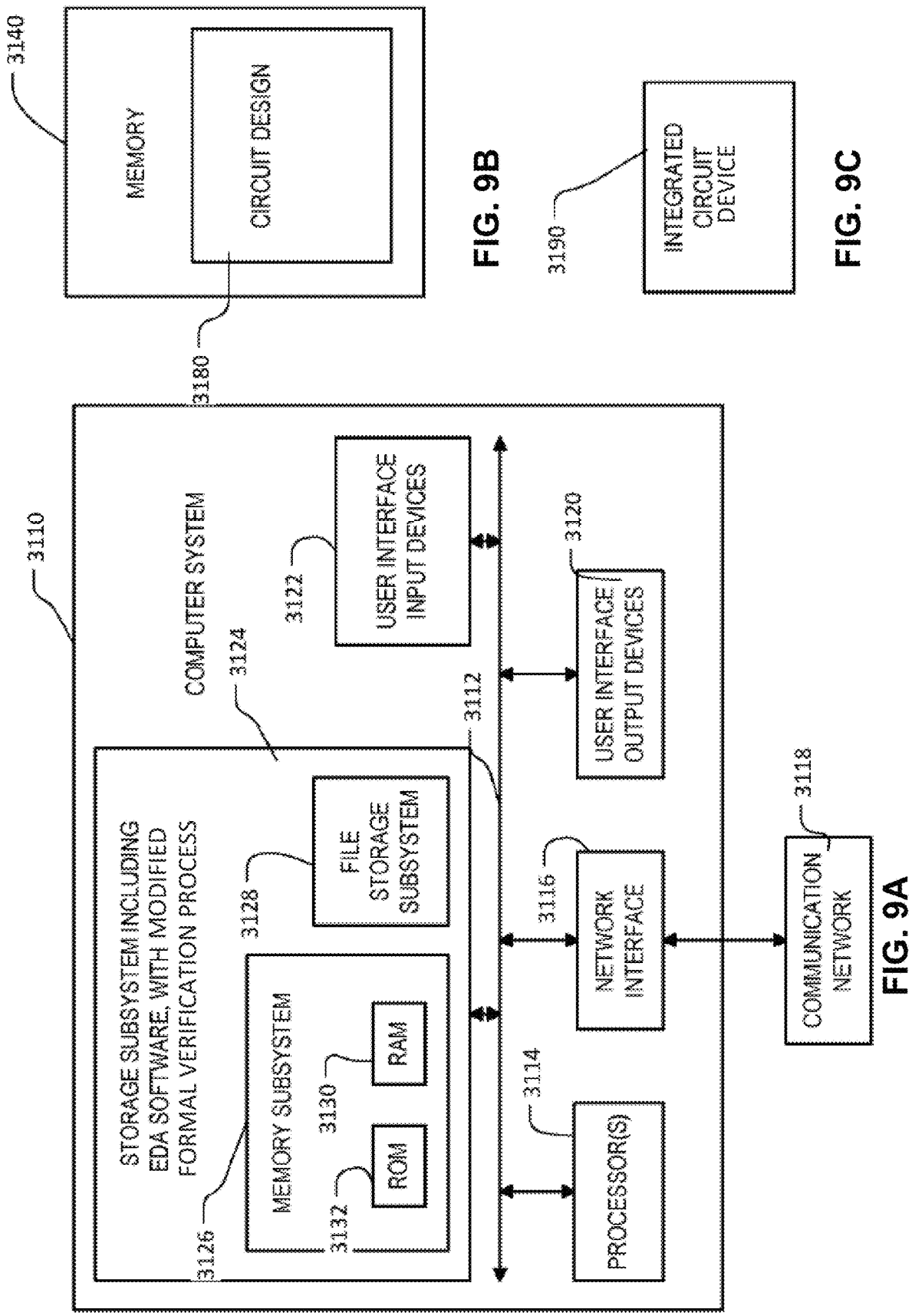

FORMAL VERIFICATION USING CACHED SEARCH PATH INFORMATION TO VERIFY PREVIOUSLY PROVED/DISPROVED PROPERTIES

RELATED APPLICATION

This application claims priority from U.S. Provisional Patent Application 62/538,196, entitled "A method and apparatus for effective caching technique to speed up Formal Verification", which was filed on Jul. 28, 2017, and is incorporated by reference herein.

FIELD OF THE INVENTION

The present invention generally relates to the development of circuit designs that are subsequently used to fabricate physical integrated circuit (IC) devices, and in particular to formal verification processes utilized to verify properties of circuit designs during development.

BACKGROUND OF THE INVENTION

As circuits have become more complex, improved methods and tools for designing, modifying, and testing those circuits have been developed. Circuits can include integrated circuits, printed circuit board circuits, and other types of circuits at a system level, sub-system level, or even at a transistor level. Improvements in circuit design include the use of electronic design automation (EDA) software tools to generate schematics of circuit designs between a logic and physical design.

Circuit designers need to test or otherwise verify their circuit designs before actually constructing a circuit from a core circuit design, and utilize a variety of software testing tools and techniques that have been developed for testing circuit designs including simulation and formal verification. While simulation can be very effective, it can become very time consuming and may not be able to exhaustively test complex circuit designs due to the large number of possible test vectors, input bits and state bits used to simulate a given circuit. Formal verification, which is presently preferred by circuit designers over simulation for verifying their circuit designs, uses mathematical techniques to either prove that, under a set of constraints, each property in the set of properties is always correct, or to disprove each property (i.e., provide an example condition, called a counterexample, that demonstrates the property is false). In some cases, where the formal verification tool cannot prove or disprove a given property within a predetermined resource limit (e.g., time or memory), the formal verification tool returns an "unknown" status for the property.

Conventional formal verification tools require CPU-intensive computations to prove or falsify properties of a core circuit design. These CPU-intensive computations are essentially repeated by a formal verification tool for every session in regression mode and/or iterative debugging/verification use cases, where each session involves analyzing a current version of the core circuit design to determine whether the current circuit design version satisfies a set of user-supplied properties. The analysis typically involves applying one or more formal verification engines (search operations) to the current circuit design version in accordance with a selected formal verification search strategy, identifying proof objects or counterexamples that prove/disprove a given property, and generating a session result report that may be utilized by the circuit designers (user) to enter corrective modifications to the core circuit design. Because each property must be proven, disproven or designated as "unknown" during every session, and because an average formal verification session involves proving/disproving a few hundred properties (i.e., at a sub-block level) to several thousand or more properties (i.e., at an SoC level), conventional formal verification techniques are considered expensive in terms of processing time and computing resources.

Traditional caching techniques are utilized in some conventional formal verification tools to reduce processing requirements by way of identifying portions of a core circuit design that do not change from one version to the next, thereby obviating the need to perform the expensive computations for properties whose true/false status is entirely based on the identified portion. That is, if a property is proven/disproven during a first session by way of analyzing a certain portion of the core circuit design, that portion of the core circuit design remains unchanged during a subsequent session, and that the formal test bench, which specifies the set of properties (assertions and constraints) is unchanged, then the property may be presumed proven/disproven based on the results generated by the first session. To identify unchanged circuit design portions, traditional caching techniques use isomorphic graph checks in conjunction with initial hash checks for each circuit design version that are compared at the beginning of each session. However, although these caching techniques may reduce total formal verification processing time when applied to multiple versions of a core circuit design, they require extensive computations that must be performed at the beginning of each session, and require a significant amount of memory space (i.e., on the order of megabytes) to generate and compare isomorphic graphs and associated hash values for each design iteration.

What is needed is a formal verification process that can quickly and efficiently identify properties that were previously proven/disproven during previous FV sessions and are not affected by changes to the IC design and the formal test bench that were entered since the previous FV session.

SUMMARY OF THE INVENTION

The present invention significantly reduces the total processing time required to perform multiple formal verification sessions curing development of a circuit design by way of storing counterexample traces and proof artifacts (collectively referred to herein as "search path information") that are generated for associated properties during an earlier formal verification session, and utilizing the stored search path information to perform search-path verification processes during a later-performed formal verification session to quickly verify that the previously proven/disprove properties remain proven/disproven. The formal verification sessions are performed during development of a core circuit design from a relatively incomplete or initial state (referred to herein as a "version") to a relatively complete or final version, with each formal verification session being initiated when a most-recent circuit design version and a corresponding set of properties are submitted to the formal verification software (solver). During an initial formal verification session (i.e., when an initial/early circuit design version and an associated property set are submitted for formal verification processing), search path information is generated by the formal verification solver for each submitted property using a full "from scratch" search process (i.e., mathematical techniques generated in accordance with a selected formal verification search strategy) that either prove that a given property in the submitted set of properties is always correct (true), or disprove the given property (i.e., provide a counterexample showing that the given property is false). According to an aspect of the invention, when a property is proven (true) using these conventional techniques, search path information is obtained from the formal verification and stored (e.g., in cache memory). That is, when proving or disproving a given property, the solver applies a reset state and various combinations of formal verification engines to the circuit design version until the solver either identifies a proof object (e.g., a compact over-approximation of the reachable set of states that at least partially proves the property to be true) or a counterexample (i.e., a sequence of states starting from a reset state and ending in a state where property is false). The search path information for each proven/disproven property is read or otherwise captured from the solver either when the solver achieves a proof object, in which case the search path information comprises an associated proof artifact including the sequence of search operations utilized to achieve the associated proof object, or when the solver achieves a counterexample, in which case the search path information comprises an associated counterexample trace including the sequence of search operations utilized to achieve the associated counterexample. Those skilled in the art will recognize that the search path information forming both the proof artifacts and the counterexample traces is a natural byproduct of conventional search processes, and therefore minimal additional time is required to capture and store the search path information (i.e., in comparison to conventional formal verification processes that do not include generating and storing search path information). According to another aspect of the present invention, the proof artifacts and counterexample traces are stored in a form that, when applied to a later (i.e., newer) circuit design version during a subsequent formal verification session, allows the formal verification solver to quickly and efficiently recreate in the later circuit design version the sequence of search operations (formal verification engines) utilized to achieve the associated proof object/counterexample in the earlier circuit design version, whereby the search path information is able to quickly verify previously proven/disproven properties when revisions entered in the later circuit design version (i.e., relative to the earlier version) do not affect the associated properties. That is, when modifications to the later circuit design version are insufficient to significantly affect relevant portions of the earlier circuit design version (e.g., the circuit design portions that defined the search path information leading from an applied reset state to a proof object that is utilized to prove a given property), then the search path information will achieve the same proof object in the later circuit design version. Note that achieving the same proof object by way of this search-path verification process obviates the need to perform expensive search processes for the associated property because the search results generated for the earlier circuit design version are equally applicable to the later circuit design version. Accordingly, the modified formal verification method of the present invention reduces the total formal verification processing time required to formally verify multiple versions of a circuit design as the circuit design is being developed by way of efficiently omitting expensive search processes for properties that remain proven/disproven in later circuit design versions, thereby allowing IC producers to benefit from the use of multiple formal verification sessions to shorten the development phase of their circuit designs, which reduces the time-to-market of IC devices subsequently fabricated in accordance with the finalized circuit designs.

When the above-mentioned search-path verification process fails to verify a previously proven/disproven property during the second formal verification session (i.e., because changes to the core circuit design prevent the applied search path information from achieving the associated proof artifact or counterexample), a second search process are performed to generate revised (second) search path information for the unverified property, and then the revised search path information is stored for use during a subsequent formal verification session. According to an embodiment of the present invention, generating the revised search path information comprises performing a path-influenced search process utilizing a portion of the earlier-generated (first) search path information to establish an intermediate state (i.e., by way of applying the search path information portion to the current circuit design version), and then utilizing the formal verification search strategy to apply additional (second) search operations to the intermediate state (i.e., effectively using the intermediate state as the reset/start state for the path-influenced search process) in order to achieve a new proof object or counterexample for the unverified property. The path-influenced search process may be implemented by sequentially erasing (truncating) the last-applied search operation from the end of the earlier-generated (first) search path information. This path-influenced search process is believed to further reduce processing time by way of avoiding previously unsuccessful search operations, and taking advantage of previously successful operations. If the path-influenced search process fails to generate a new proof object or counterexample for the unverified property, then a full "from scratch" search process may be utilized.

BRIEF DESCRIPTION OF THE DRAWINGS

These and other features, aspects and advantages of the present invention will become better understood with regard to the following description, appended claims, and accompanying drawings, where:

FIGS. 9A, 9B and 9C are simplified block diagrams of a computer system suitable for use with embodiments of the present invention, as well as circuit design and circuit devices produced using the present invention.

DETAILED DESCRIPTION OF THE DRAWINGS

The present invention relates to an improved formal verification process for use during the development of core circuit designs that are subsequently utilized in the fabrication of integrated circuit devices based on the core circuit designs. The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary embodiments. In the interest of not obscuring the presentation of embodiments of the claimed inventions, in the following Detailed Description, some processing steps or operations that are known in the art may have been combined together for presentation and for illustration purposes and in some instances may have not been described in detail. However, a person skilled in the art will recognize that these embodiments may be used in commerce without these specific details or with equivalents thereof. In other instances, well-known processes and devices are not described in detail as not to unnecessarily obscure aspects of these embodiments. In other instances, some processing steps or operations that are known in the art may not be described at all. The following description is instead focused on the distinctive features or elements of various embodiments of the claimed inventions. Furthermore, while this description may refer to some components of the structure in the singular tense, more than one component may be depicted throughout the figures and like components are labeled with like numerals.

Figure 1:
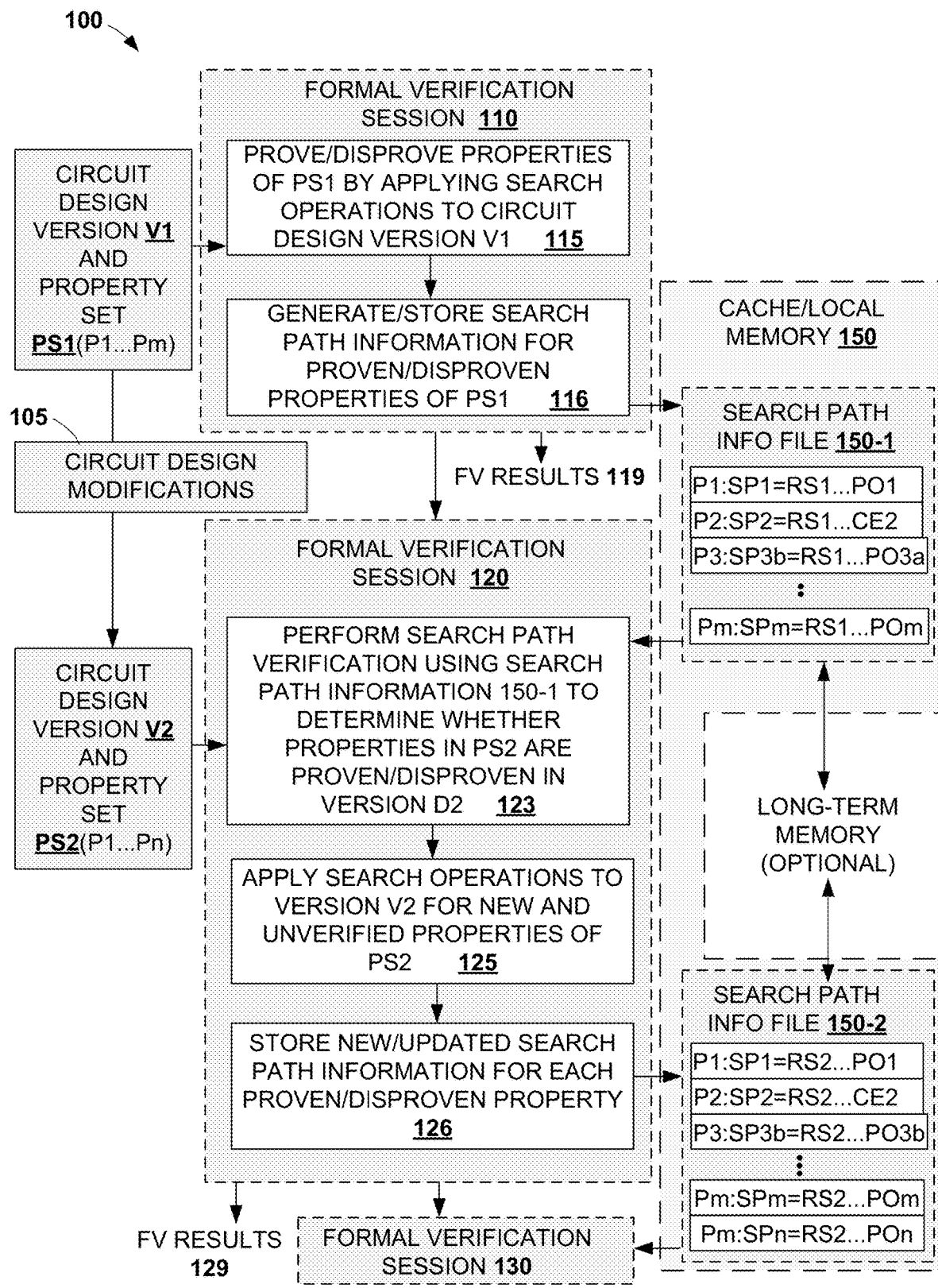
FIG. 1 is a flow diagram showing a modified formal verification process according to a generalized embodiment of the present invention.

FIG. 1 is a flow diagram that functionally depicts a modified formal verification method 100 for formally verifying multiple sequentially-generated versions of a core circuit design during development of the circuit design for subsequent fabrication as an associated IC device according to a generalized embodiment of the present invention. Referring to the left side of FIG. 1, method 100 is configured to communicate with software tools that are capable of generating/receiving, storing and modifying a core circuit design in the form of sequentially generated circuit design versions V1 and V2, and capable of generating/receiving and storing corresponding sets of properties with each circuit design version (i.e., property set PS1 is stored in association with circuit design version V1, and property set PS2 is stored in association with circuit design version V2). Referring to the central portion of FIG. 1, method 100 is implemented by a formal verification solver (software program) that is configured to formally verify circuit design versions V1 and V2 during two separate formal verification sessions 110 and 120, where session 110 involves formally verifying (first) circuit design version V1 using (first) property set PS1, and session 120 involves formally verifying (second) circuit design version V2 using (second) property set PS2. In one embodiment, the formal verification solver is configured to perform search operations in either a regression mote or an iterative deign verification/debugging mode, and the modified formal verification methodology described below may be implemented in conjunction with either of these modes.

Referring to the left side of FIG. 1, circuit design versions V1 and V2 represent two sequential versions of a core circuit design that are submitted for formal verification during development of a core circuit design. For descriptive purposes, circuit design version V1 is characterized below as an initial version of the core circuit design, and circuit version V2 represents a next-sequential (second) version of the core circuit design that a user decided to formally verify. Initial circuit design version V1 is typically submitted for formal verification during a relatively early stage in the circuit design development process. Circuit design version V2 may be a revised version of the initial circuit design that has undergone a circuit design modification process 105, which may be conducted between sessions 110 and 120, and may involve the addition of circuitry intentionally omitted from initial circuit design version V1, or may include corrections to the initial circuit design in accordance with formal verification results provided to a user after session 110. Versions V1 and V2 may represent sequential versions submitted to formally verify incremental changes during regularly scheduled regression testing (e.g., daily or on some other schedule). In some instances, version V2 may be identical to version V1 (i.e., no changes to version V1 are entered during circuit design modification process 105).

Property sets PS1 and PS2 include multiple properties utilized during verification of circuit design versions V1 and V2, respectively, during the associated formal verification sessions 110 and 120. As known in the art, formal verification uses mathematical techniques to either prove that, under a set of applied engines/search operations established by a selected formal verification search strategy (i.e., the proprietary search strategy implemented by an EDA tool provider that implements a given formal verification process), each property of a provided property set is always correct, or to provide an example condition (called a counterexample) that demonstrates the property is false (disproven). In the exemplary embodiment, property set PS1 includes properties P1 to Pm that are either proven or disproven (herein "proven/disproven") by way of applying search operations to circuit design version V1 during session 110, and property set PS1 includes properties P1 to Pn that are proven/disproven by way of applying search operations to circuit design version V2 during session 120. Note that the listed properties of property sets PS1 and PS2 (i.e., "P1 to Pm" and "P1 to Pn", respectively) are intended to indicate that the two property sets have at least one common property (i.e., property P1 is identical in both property sets PS1 and PS2), but may have a different number of properties (e.g., property set PS1 may have fewer properties than property set PS2), or may have the same number of properties, but at least one property in set PS1 is not in property set PS2, and at least one property in property set PS2 is not in proper set PS1. Also note that each property referenced below (e.g., property "P1") may refer to a set of multiple properties that may be simultaneously verified (i.e., formal verification engines may be applied to multiple properties simultaneously).

Referring to the central portion of FIG. 1, both formal verification sessions 110 and 120 involve the execution of essentially the same process to formally verify circuit design versions V1 and V2, respectively, and both output similar information. Specifically, formal verification session 110 utilize a formal verification solver to process circuit design version V1, and outputs formal verification session results (FV RESULTS) 119 and search path information file 150-1, and formal verification session 120 utilizes the same formal verification solver to process circuit design version V2, and outputs formal verification session results (FV RESULTS) 129 and search path information file 150-2. Session results 119 operably informs a user either that (a) each given property of associated property set PS1 is proven true with respect to associated circuit design version V1, (b) each given property of associated property set PS1 is false/disproven with respect to associated circuit design version V1, or (c) the status of a given property is "unknown". Session results 129 provide the same proven/disproven property information for each property of property set PS2, i.e., as applied to associated circuit design version V2. Search path information file 150-1 includes a proof artifact for each property of property set PS1 that was proven true during session 110, and includes a counterexample trace for each property of property set. PS1 that was disproven ring session 110. Search path information file 150-2 includes proof artifacts and counterexample traces for corresponding properties of property set PS1 that were proven/disproven during session 120.

Although both formal verification sessions 110 and 120 involve execution of the same overall methodology, formal verification session 110 typically takes significantly longer to perform than formal verification session 120 when, as established for the applied example, circuit design version V1 represents an initial version of the core circuit design subjected to formal verification (more specifically, the first version to be subjected to the modified formal verification methodology of the present invention). That is, because each property of initial property set PS1 is proven/disproven for the first time during session 110, every property P1 to Pm is analyzed using expensive (i.e., in terms of time and computing resources) conventional search processes involving mathematical techniques that are based on a selected formal verification search strategy, whereby formal verification session 110 takes a relatively long time to complete in comparison to subsequent formal verification sessions, but substantially the same amount of time required to perform formal verification of property set P1 using conventional formal verification methods. Formal verification session 120 performs formal verification of property set PS2 in a substantially shorter time period by performing search-path verification on properties (e.g., property P1) of property set PS2 that have corresponding search path information stored in search path information file 150-1. That is, as explained in additional detail below, search path information file 150-1 is utilized during formal verification session 120 to quickly verify certain properties of property set. PS2 that were previously proven/disproven in session 110, thereby reducing the time required to perform session 120 by obviating the need to use expensive search processes to generate proof artifacts or counterexample traces for the verified proven/disproven properties. Note that, although the blocks depicted in FIG. 1 may suggest that formal verification sessions 110 and 120 utilize slightly different methodologies, these differences are entirely attributed to the premise of the presented example (i.e., that circuit design version V1 is an initial circuit design subjected to formal verification analysis, and therefore session 110 must be conducted without having access to previously generated search path information), and that the formal verification solver executes the same software program during both sessions 110 and 120.

Referring to the upper central portion of FIG. 1, initial formal verification session 110 includes (block 115) applying a reset state RS1 and search operations to circuit design version V1 according to a formal verification search strategy to prove/disprove each property of property set PS1, and (block 116) storing search path information (i.e., either a proof artifact or a counterexample trace) for each property that is proven/disproven during session 110.

Figure 2:
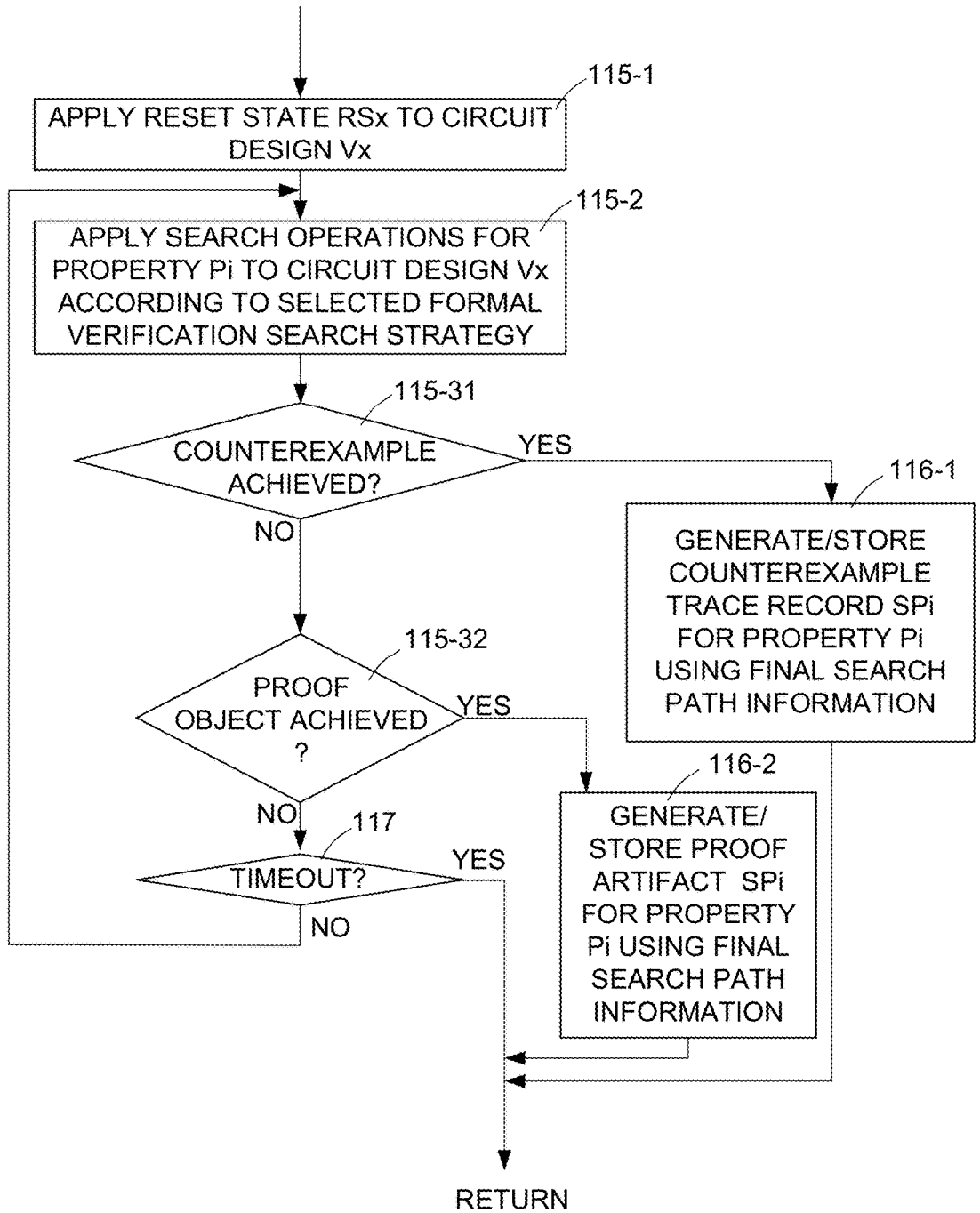
FIG. 2 is a flow diagram showing a full search process utilized by the modified formal verification process of FIG. 1 according to an exemplary embodiment of the present invention.
Figure 2A:
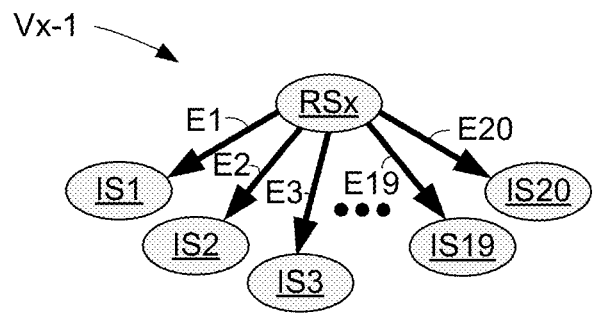
FIGS. 2A, 2B and 2C are simplified exemplary search-tree diagrams depicting search path information generated by the full search process of FIG. 2.
Figure 2B:
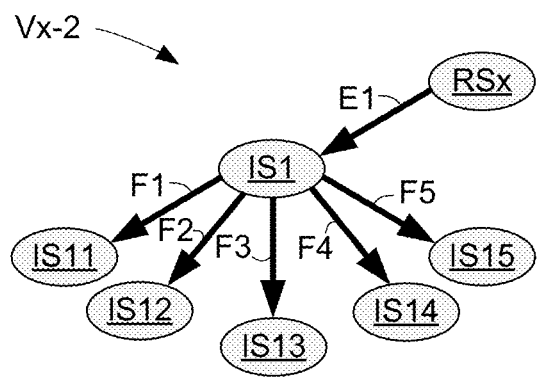
Figure 2C:
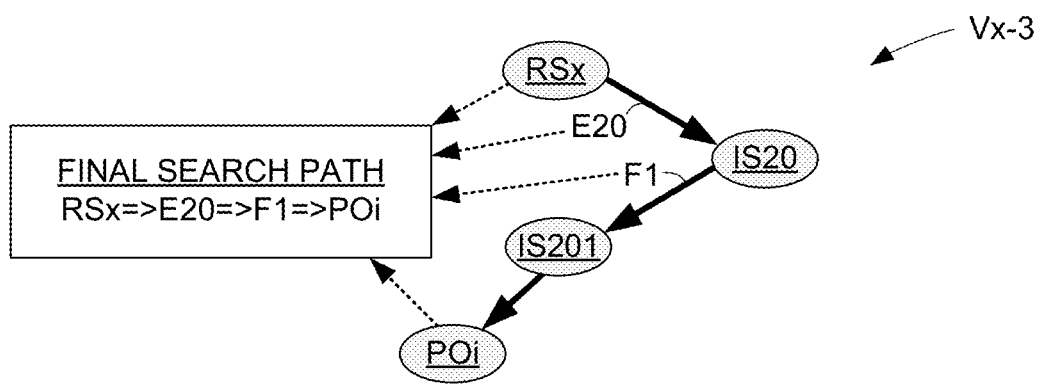

FIG. 2 shows additional details regarding search and storage operations (blocks 115 and 116 of FIG. 1) as applied to a single property according to an exemplary specific embodiment of the present invention, and FIGS. 2A to 2C show simplified search-tree diagrams depicting exemplary search/storage operations performed in accordance with the exemplary embodiment of FIG. 2. Because the search and storage operations depicted in FIG. 2 are utilized to prove/disprove each property of property set PS1 during session 110, and are optionally utilized to prove/disprove certain properties of property set PS2 (i.e., new and unverified properties, described below) when formally verifying circuit design version V2 during session 120 (described below), the flow diagram of FIG. 2 references a generalized property "Pi" and a generalized design version Vx. That is, property Pi may represent any of properties P1 to Pn of property sets PS1 and PS2, and may represent any circuit design version (e.g., versions V1, V2, or any subsequent circuit design version).

Referring to the upper portion of FIG. 2, a given search process begins with the application of a reset state RSx to associated circuit design version Vx (block 115-1), and then applies a first search operation (block 115-2). A reset state RSx is determined for each associated circuit design version Vx before formal verification, and circuit design version Vx is reset into reset state RSx before beginning formal verification of each property Pi. Reset state Rx may be different or essentially identical in two sequential circuit design versions (e.g., reset state RS1 utilized during session 110 may be the same or different from a (second) reset state RS2 applied to circuit design version V2 during session 120). The simplified model generated by applying reset state RSx and the first search operation (e.g., a formal verification engine) to circuit design Vx is then analyzed to determine if a counterexample is achieved (block 115-31) or a proof object is achieved (block 115-32). If neither a counterexample nor a proof object are achieved after the last-applied search operation (NO in both blocks 115-31 and 115-32), then a timeout check is performed (block 117) and then, assuming no time or other resource limit has been reached, control is passed back along the NO branch from block 117 to block 115-2 for application of a new or additional search operation. If a counter example is achieved (YES in block 115-31), then a counterexample trace record SPi is generated and written/stored in cache memory for property Pi using final search path information that forms the shortest path from reset state RSx to the counterexample (block 116-1). If a proof object is achieved (YES in block 115-32), then a proof artifact SPi is generated and written/stored in cache memory using final search path information that forms the shortest path from reset state RSx to the proof object (block 116-2). When either a counterexample or a proof artifact are achieved, or when a resource limit has been reached (YES branch from block 117), control returns for selection of a next property (if any uncheck properties remain). Note that the example described with reference to FIG. 2 is merely exemplary and not intended to be limiting. For example, in other embodiments the search processes intended to achieve counterexamples may be performed in parallel with search processes intended to achieve proof artifacts, with a race-to-finish condition controlling completion of the search processes for property (or set of properties) Pi.

FIGS. 2A to 2C show search tree diagrams depicting exemplary search processes performed in accordance with the flow diagram of FIG. 2. FIG. 2A is a search tree diagram depicting a model Vx-1 representing circuit design version Vx application of reset state RSx, and shows alternative intermediate states IS1 to IS20 that are achieved after the formal verification solver sequentially applies a first series of formal verification engines (search operations) E1 to E20 to circuit design version Vx in reset state RSx. Because none of intermediate states IS1 to IS20 represents either a counterexample or a proof object that directly proves or disproves property Pi, control of the search operation process loops back to block 115-2 after each formal verification engine E1 to E20 is sequentially applied to circuit design version Vx in reset state RSx. FIG. 2B depicts a model Vx-2 during a subsequent portion of the search process when the formal verification solver tries various combinations of formal verification engines E1 to E20 and F1 to F5, where design version model Vx-2 shows a series of intermediate states IS11 to IS15 that are achieved after the formal verification solver sequentially combines engine E1 with each of engines F1 to F5. Because none of the intermediate states IS11 to IS15 either directly proves or directly disproves property Pi, control passes from the model depicted in FIG. 2B to a next combination (e.g., reset state RSx plus the combination of engines E1 and F1). FIG. 2C shows a model Vx-3 in which a proof object POi is achieved for property Pi by way of combining engines E20 and F1, thereby achieving intermediate state IS201. In this example, the formal verification solver determines that engine F1 can prove property Pi (i.e., achieve proof object POi) based on the simplified model received from engine E20. Accordingly, a proof artifact is generated based on the final search path including reset state RSx followed by engine E20 followed by engine F1. In general, a single engine such as F1 may itself have a complex search tree as well; in these cases, the successful paths within a single engine are also included in the search path information.

Referring again to the upper portion of FIG. 1, during session 110 properties P1, P2, P3 and Pm are proven/disproven in accordance with the search path operations described above, whereby corresponding search path information records SP1, SP2, SP3 and SPm are generated and stored in search path information file 150-1 for each proven/disproven property of property set PS1. For example, a first set of search operations are applied circuit design version V1, after being reset into (first) reset state RS1, in accordance with the selected formal verification search strategy that begin with reset state RS1 and ultimately achieve a proof object P01 that proves property P1 of property set PS1, whereby a first record including a proof artifact (search path information) SP1 is written into file 150-1 for property P1, where proof artifact SP1 includes all search operations (indicated by " . . . " after reset state RS1) utilized to achieve proof object P01 for property P1. Similarly, counterexample trace SP2 is a second record stored file 150-1 for property P2, and includes all search operations applied to circuit design version V1 (i.e., after being reset to reset state RS1) to ultimately achieve a counterexample CE2 that disproves property P2. Additional search path information is stored in search path information file 150-1 for each remaining property P3 to Pm of property set PS1 that is proven/disproven during session 110. Note that search path information file 150-1 does not include search path information for properties of property set PS1 that were not proven/disproven during session 110 (e.g., when non-convergence occurs within a set time limit for a given property, whereby the property is designated as "unknown" and the search process is suspended by way of the YES branch in block 117 of FIG. 2). Note also that reset state RS1 is depicted as being part of each search path information record to indicate that all listed search operations stem from reset state RS1, and that reset state RS1 may not be included in search path information records SP1 to SPm in some embodiments.

Referring again to the right side of FIG. 1, in one embodiment search path information is stored in cache memory 150 using a format that facilitates quick verification of the proven/disproven properties during subsequent formal verification sessions (i.e., in substantially less processing time than is required by the conventional isomorphic graph check approach). Note that the format in which search path information is stored in files 150-1 and 150-2 may vary depending on the programming language(s) supported by the host EDA tool and/or formal verification solver. In one embodiment, each proof artifact (e.g., search path information SP1 for property P1) and each counterexample trace (e.g., search path information SP2 for property P2) is stored in a persistent format (e.g., standard XML/binary format) and includes design signal names and Boolean formulas over the design signal names, or assignments of values to design signals. According to a presently preferred embodiment, search path information files 150-1 and 150-2 are stored in persistent or local storage (e.g., in cache memory 150, as indicated in FIG. 1) to facilitate rapid access by the formal verification solver during session 120. In other embodiments, or between formal verification sessions, search path information files may be transferred to a server or other long-term storage unit. Those skilled in the art will recognize that there are some choices involved as to what types of database/file systems to use. In any case, the search path information is hard to compute from scratch (i.e., it can only be determined using an expensive "full" search process), but once this information is stored in a persistent format and available to the formal verification solver, it can be quickly re-verified and reused in an efficient manner, thereby obviating the need to repeat the expensive search process.

Referring to block 120 in FIG. 1, in accordance with the example established above, formal verification session 120 represents the second time the core circuit design is submitted for formal verification, and involves determining whether each property P1 to Pn in property set PS2 proves true or false with respect to (second) circuit design version V2. Session 120 generally includes performing a search-path verification process for each previously proven/disproven property of property set PS2 (block 123), applying search operations to circuit design version V2 for new and unverified properties of property set PS2 (i.e., properties that were not verified as proven/disproven by way of search-path verification) (block 125), and then storing new or updated search path information for each property of property set PS2 that is proven/disproven by way of search processes performed in accordance with block 125.

According to an aspect of the invention, search-path verification includes utilizing at least a portion of first search path information file 150-1, which is stored in and read from cache memory 150, to quickly determine whether previously proven/disproven properties in file 150-1 and appearing in second property set PS2 are still proven/disproven with respect to circuit design version V2 without having to performing expensive search processes according to the selected formal verification search strategy (e.g., as described above with reference to FIG. 2). As explained in additional detail below, each search-path verification process involves applying the stored search path information for each proven/disproven property to circuit design version V2 (i.e., after circuit design version V2 is reset into a corresponding reset state RS2), and determining whether the same counterexample or proof object are achieved, whereby method 100 improves performance of a host EDA tool by reducing the total processing time required to formally verify multiple versions of the circuit design during development, thereby providing a final version of the circuit design for subsequent fabrication as an associated integrated circuit device in substantially shorter amount of time than is possible using conventional formal verification techniques.

Figure 3:
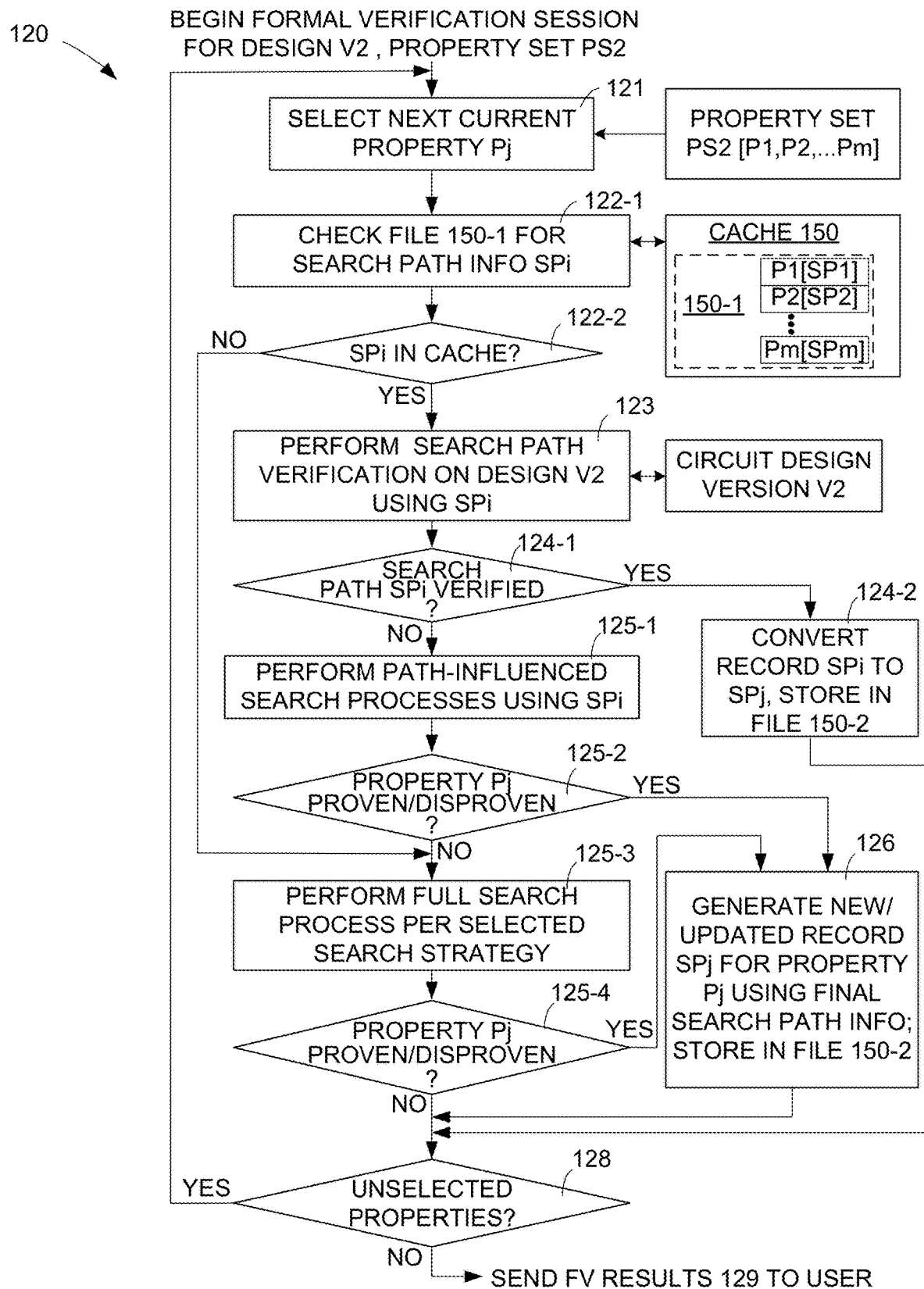
FIG. 3 is a flow diagram showing a modified formal verification process according to a specific embodiment of the present invention.
Figure 3A:
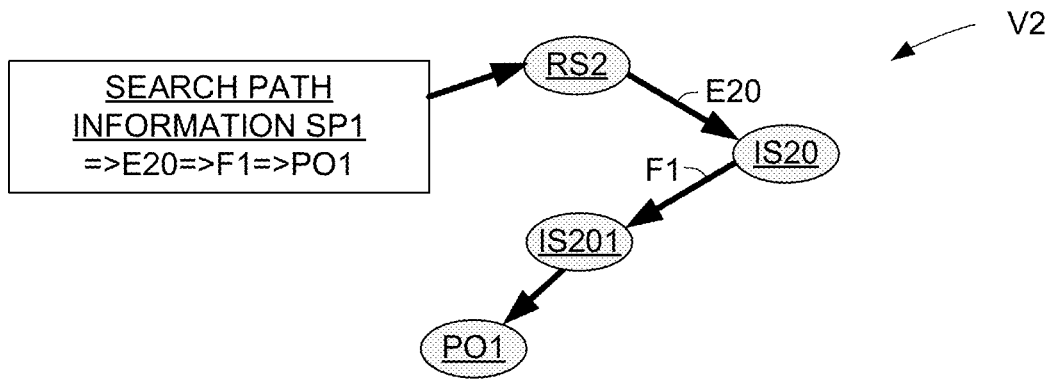
FIGS. 3A, 3B and 3C are simplified exemplary search-tree diagrams generated in accordance with a search-path verification process that is utilized during the modified formal verification process of FIG. 3.
Figure 3B:
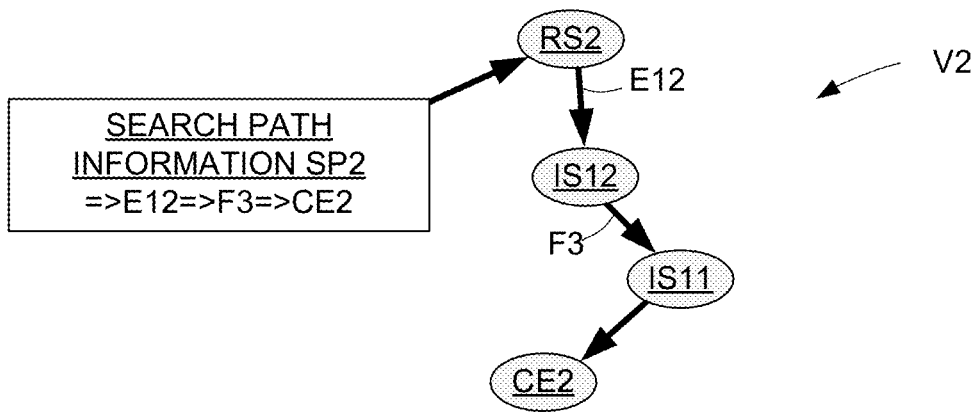
Figure 3C:
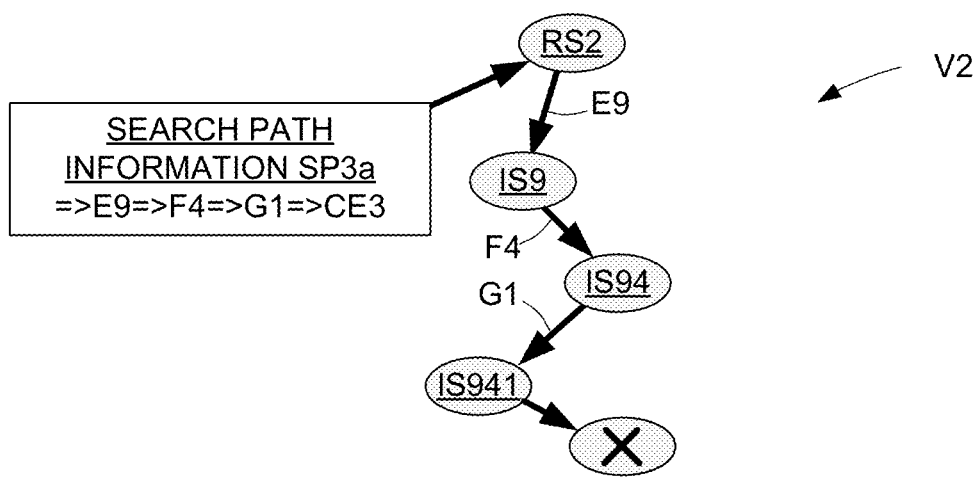

FIG. 3 shows additional details regarding the various processes performed during second formal verification session 120 as applied to circuit design version V2 and property set PS2 according to an exemplary specific embodiment of the present invention, and FIGS. 3A to 3C show simplified search-tree diagrams depicting exemplary search-path verification processes performed in accordance with block 123 of FIG. 3. Because the verification, search and storage operations depicted in FIG. 3 are utilized to prove/disprove each property of property set PS2 during session 120, the flow diagram of FIG. 3 references a generalized property "Pj". That is, property Pj in FIG. 3 may represent any of properties P1 to Pn of property set PS2. Moreover, the present example assumes search path information generated during session 120 will be utilized to prove/disprove certain properties of a subsequently submitted property set when formally verifying a subsequent circuit design version during an optional formal verification session 130 (shown at the bottom of FIG. 1). That is, if circuit design version V2 were a final version, then the generation of search path information file 150-2, which is described with reference to blocks 125 and 126 in FIG. 1 and described in additional detail below, may be optionally omitted.

Referring to the upper portion of FIG. 3, session 120 begins with the selection of a property Pj (block 121) from property set PS2. Next, search path information file 150-1 is checked for search path information SPi in file 150-1 corresponding to property Pj (block 122-1). For example, when property Pj corresponds to property P1, then block 122-1 involves checking file 150-1 for search path in formation SP1 corresponding to property P1. If no corresponding search path information is stored in file 150-1 for property Pj, then control is passed down to block 125-3 (discussed below). If corresponding search path information SPi is found in file 150-1, then a search-path verification process is performed by applying search path information SPi to circuit design version V2 (block 123), and then the results of the verification process are checked (block 124-1).

The search-path verification process (block 123) effectively utilizes the search path information generated during session 110 as a type of "bread crumb" information to verify previously proven/disproven properties without having to perform expensive search processes that typically reconstruct multiple unproductive search tree branches. In general, when a given property Pj (e.g., property P1) of property set PS2 has corresponding search path information SPi (e.g., search path information SP1) stored in file 150-1, then the formal verification solver applies the previously generated search path information SPi to circuit design version V2, and determines from the resulting model whether the same proof artifact or counterexample are achieved that was achieved in session 110. In effect, this search-path verification process allows the formal verification solver to directly redo (reconstruct) the search conditions in circuit design version V2 that were utilized to achieve the associated proof object or counterexample in circuit design version V1. If property Pj has corresponding search path information SPi in file 150-1, and if corresponding portions of the core circuit design have not significantly changed between sessions 110 and 120, then the applied search path information SPi achieves the same proof artifact or counterexample trace in circuit design version V2 that was achieved in circuit design version V1. Conversely, if corresponding portions of the core circuit design have significantly changed between sessions 110 and 120, then the applied search path information SPi will fail to achieve the same results (i.e., either a counterexample or a proof object) in circuit design version V2.

FIGS. 3A to 3C include search-tree-type diagrams depicting exemplary search-path verification processes performed in accordance with block 123. FIG. 3A depicts the application of search path information SP1 from file 150-1 to circuit design version V2, and indicates that applied reset state RS2 followed by engine E20 followed by engine F1 allows the formal verification solver to achieve proof object P01, thereby verifying previously proved property P1 is also proved in circuit design version V2 in a very short amount of time (i.e., in comparison with the full "from scratch" search processes performed to generate search path information 150-1 during session 110). Similarly, FIG. 3B depicts applying search path information SP2 to circuit design version V2, and verifying that counterexample CE2 is achieved, whereby previously disproved property P2 is verified. FIG. 3C depicts an example of a failed search-path verification process associated with property P3, where search information SP3a read from file 150-1 is applied to circuit design version V2. Note that search path information SP3a (i.e., engine E9 followed by engine F4 followed by engine G1) was utilized to achieve a proof object PO3a in circuit design version V1 during session 110. As indicated in FIG. 3C, in this example, the formal verification solver is unable to achieve proof object PO3a (indicated by the "X" leading from intermediate state IS941), whereby previously proved property P3 is unverified for circuit design version V2. As mentioned above, the failure of search path information SP3a to achieve proof object PO3a occurs when portions of the core circuit design utilized to prove property P3 during session 110 were sufficiently changed between sessions 110 and 120 such that search path information SP3a fails to reconstruct the same search conditions in circuit design version V2 that were utilized to achieve proof object PO3a in circuit design version V1.

Referring again to block 124-1 in FIG. 3, when the search-path verification process verifies proved/disproved property Pj using search path information SPj, then control passes by way of the YES branch to block 124-2. Conversely, when the search-path verification process fails to verify proved/disproved property Pj using search path information SPj, then control passes from block 124-1 by way of the NO branch to block 125-1.

As indicated by block 124-2 (FIG. 3), when the search-path verification process verifies proved/disproved property Pj (YES branch from block 124-1), search path information SPi from file 150-1 is effectively converted into (e.g., transferred or re-designated as) corresponding counterexample trace or proof artifact SPj that is stored in file 150-2. That is, when search information generated during formal verification session 110 successfully achieves the same proof object or counterexample during a corresponding search path-verification process performed on circuit design version V2 during session 120 (e.g., as described above with reference to FIGS. 3A and 3B), then search path information SPj stored in file 150-2 during session 120 is substantially identical to search path information SPi previously stored in file 150-1 for a given property Pi included in both property sets PS1 and PS2. For example, as indicated by way of comparing cache files 150-1 and 150-2 in FIG. 1, other than the designate reset state (which is not included in some embodiments), the series of search operations listed in search path information SP1 for verified previously proven property P1 is the same in both cache files 150-1 and 150-2, and the series of search operations listed in search path information SP2 for verified previously disproven property P2 is the same in both cache files 150-1 and 150-2. In this manner the modified formal verification methodology further reduces processing time by way of re-using previously generated search path information.

When the search-path verification process fails to verify proved/disproved property Pj (NO branch from block 124-1), search path information SPi from file 150-1 is no longer valid and must be discarded (i.e., not copied to file 150-2), and one or more (second) search operations is/are performed to generate updated/revised (second) search path information that proves/disproves property Pj with respect to circuit design version V2. According to an embodiment of the present invention, these (second) search operations are initially applied using a path-influenced search process, and then, if the path-influenced search process fails to achieve a proof object or counterexample (NO branch in block 125-2), implementing a full "from scratch" search process. As described below with reference to block 125-1, each path-influenced search process involves applying a portion of previously generated search path information SPi to circuit design version V2 in order to establish an intermediate state, and then causing the formal verification solver to apply search operations to the intermediate state in order to (possibly) achieve a counterexample or proof object in less time than would be needed to perform a full search process (i.e., beginning with the associated reset state RSx). As described below with reference to block 125-3, a full "from scratch" search process is implemented only after both the search path-verification process (block 123) and the path-influenced search process (block 125-1) fail to prove/disprove property Pj, and essentially tasks the formal verification solver to apply the appropriate reset state (i.e., reset state RSx) to the current circuit design version Vx, and then to apply search operations using the methodology described above. If updated/revised (second) search path information is generated using either of the path-influenced or full search approaches, then the revised/updated (second) search path information SPj is stored in search path information file 150-2 in a manner that supersedes any earlier-generated search path information for property Pj (i.e., such that a subsequent formal verification session only accesses revised/updated (second) search path information SPj, and cannot access original search path information SPi).

Figure 4:
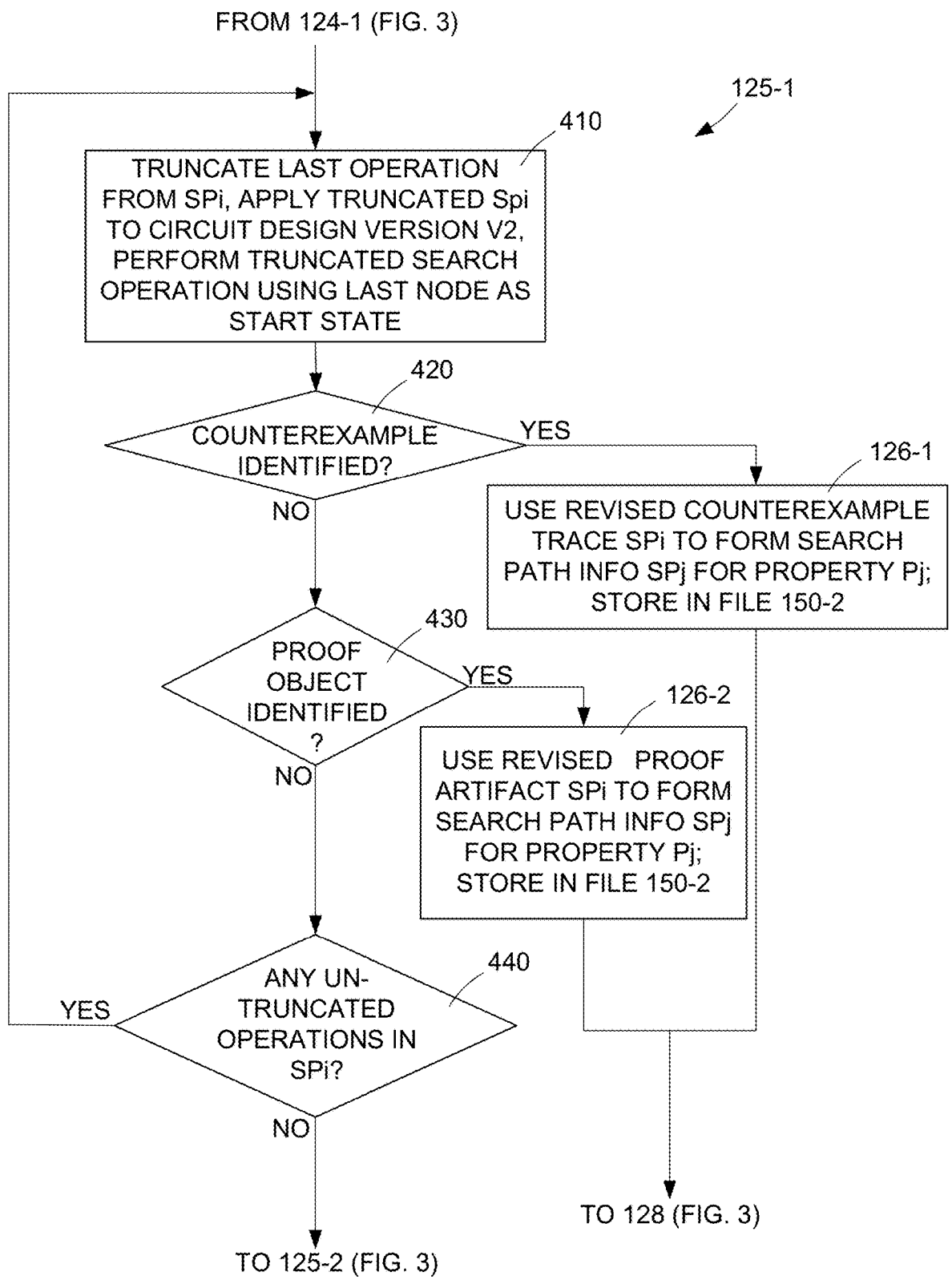
FIG. 4 is a flow diagram showing an exemplary path-influenced search process that is optionally utilized during the modified formal verification process of FIG. 3.
Figure 4A:
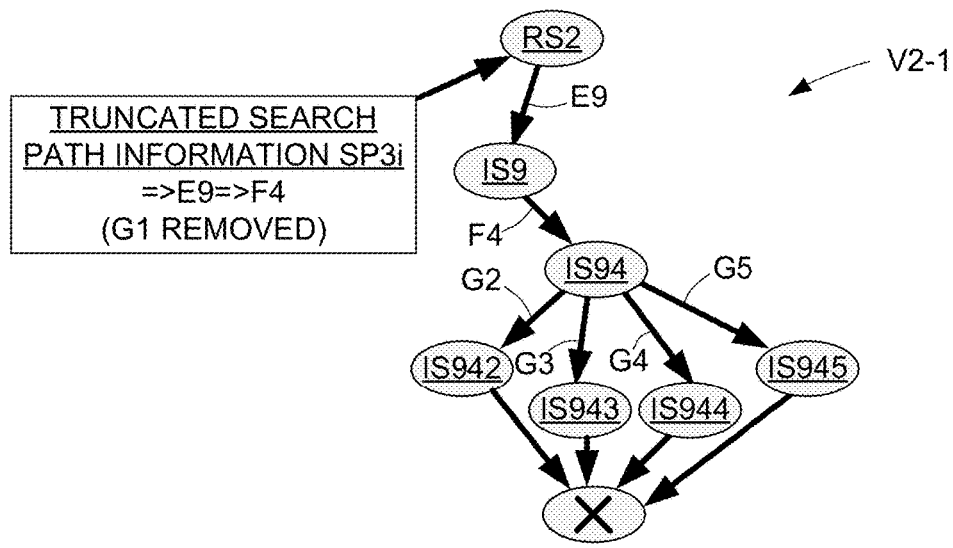
FIGS. 4A and 4B are simplified search-tree diagrams depicting an exemplary path-influenced search process generated in accordance with the search-path verification process of FIG. 4.
Figure 4B:
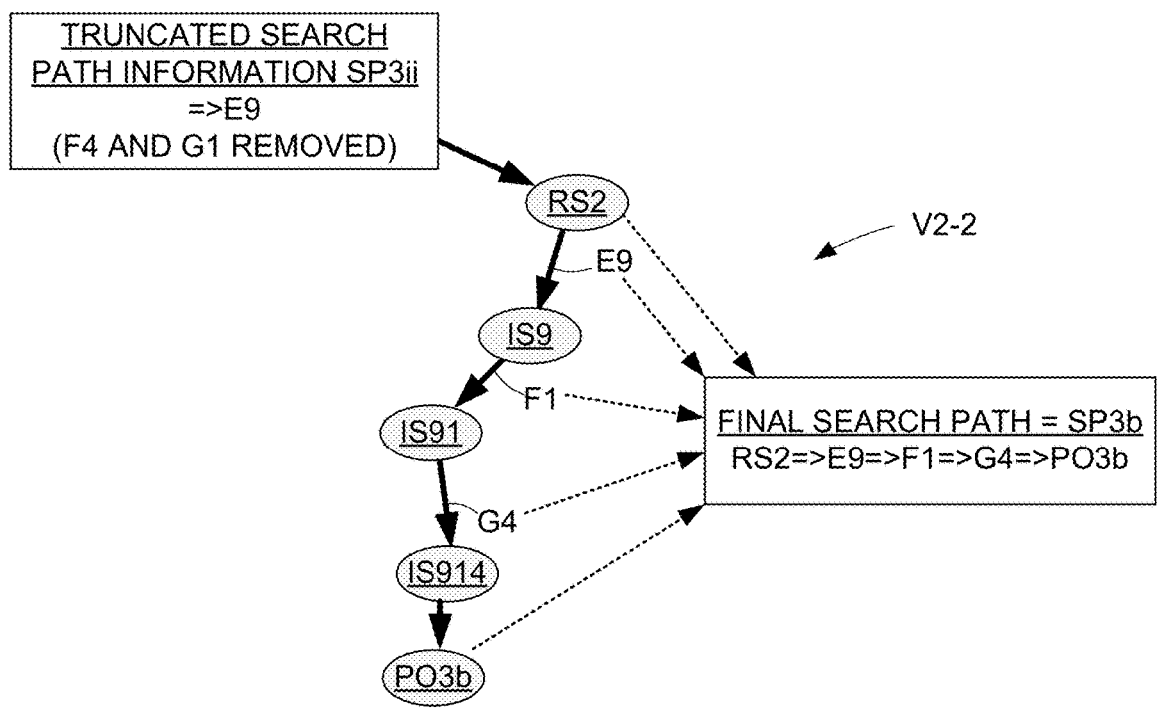

FIG. 4 shows additional details regarding path-influenced search processes and subsequent storage (blocks 125-1 and 126 of FIG. 1) as applied to an unverified property Pj according to an exemplary specific embodiment of the present invention, and FIGS. 4A and 4B are simplified search-tree diagrams depicting an exemplary path-influenced search process performed in accordance with the approach illustrated in FIG. 4.

Referring to block 410 in FIG. 4, a path-influenced search process for unverified property Pj begins by truncating the last-applied formal verification engine (search operation) from search path information, then applying the truncated search path information to circuit design version to establish an associated intermediate state (i.e., by way of generating a model based on the truncated search path information, and then applying search operations to the model using the associated intermediate state as a start state). In one embodiment, the search operations are applied by the formal verification solver using the selected formal verification search strategy, and results generated by applying search operations to the modified model are checked after each sequential search operation is applied. If a counterexample is achieved during the path-influenced search operations applied to truncated search path information SPi (block 420), then the revised search path information utilized to achieve the counterexample is utilized to form a counterexample trace SPj for property Pj, which is then stored in file 150-2. Conversely, if a proof object is achieved during the path-influenced search process (block 430), then the revised search path information is utilized to form a proof artifact SPj for property Pj, which is then stored in file 150-2. After search path information SPj is stored in file 150-2 as either a proof object or a counterexample trace, control is passed from one of blocks 126-1 and 126-2 to block 128 (shown in FIG. 3). If neither a counterexample nor a proof object are achieved within a prescribed search period (e.g., based on a preset time limit), then control passes along the NO branches from both blocks 420 and 430 to block 440. In block 440, truncated search path information SPi is analyzed to determine if further truncation is possible (e.g., if one or more additional "upstream" search operations may be omitted without reaching reset state RSx). If so (YES branch from block 440), then control is passed back to block 410 for further truncation of search path information SPi, which is performed as described above with reference to block 410. The loop formed by blocks 410 to 440 may be repeated until truncated search path information SPi comprises only reset state RSx and an initial search operation, at which point control may be passed along the NO branch from block 440 to block 125-3 (FIG. 3).

FIGS. 4A and 4B illustrate an example of a path-influenced search process performed for property P3, which is described above and being unverified after the search-path verification process described above with reference to FIG. 3C. FIG. 4A depicts a first model V2-1 generated from circuit design version V2 during a first pass through the loop formed by blocks 410 to 440 (FIG. 4) in which a last search operation (i.e., engine G1) is truncated from search path information SP3, thereby forming truncated search path information SP3*i* including reset state RS2 followed by engine E9 followed by engine F4. FIG. 4 also indicated that applying truncated search path information SP3*i* to circuit design version V2 generates first model V2-1 having intermediate state IS94, which serves as a starting point for the first phase of the path-influenced search process. As also indicated in FIG. 4A, for purposes of explanation it is assumed that the path-influenced search operations sequentially applied to intermediate state IS94 include engines G2 to G5, and that the formal verification solver is unable to achieve either a proof object or a counterexample after applying each of these search operations (i.e., as indicated by the "X" leading from corresponding resulting intermediate states IS942 to IS945), whereby property P3 remains unproven for circuit design version V2 after the first phase of the path-influenced search process. Referring briefly to FIG. 4, assuming all search process options are exhausted for truncated search path information SP3$i$, control is passed from block 440 back to block 410, and engine F4 is truncated from the end of search path information SP3$i$ to form secondary truncated search path information SP3$ii$. As depicted in FIG. 4B, secondary truncated search path information SP3$ii$ is then applied to circuit design version V2 to generates second model V2-2 having intermediate state IS9, which serves as a starting point for the second phase of the path-influenced search process. As also indicated in FIG. 4B, for purposes of explanation it is assumed that the path-influenced search operations sequentially applied to intermediate state IS9 include at one point the application of engines F1 and G4, and that the formal verification solver is able to achieve a proof object PO3$b$ by way of resulting state IS914, whereby property P3 is proven for circuit design version V2 without having to implement an expensive full search process. Referring again to FIG. 4, after proof object PO3$b$ is identified, control passes from block 430 to block 126-2, whereby revised search path information SP3$b$ (i.e., engine E9 followed by engine F1 followed by engine G4) is stored in file 150-2 for property P3. Control then passes from block 126-2 to block 128 (FIG. 3).

Referring to block 125-3, which is located near the central portion of FIG. 3, a full "from scratch" search process is performed for new properties appearing in property set PS2 (e.g., property Pn, which was not included in property set PS1), for properties that were not proven or disproven during formal verification session 110, and for unverified previously proven/disproven properties that remain unproven after path-influenced search processing. Specifically, control is passed to block 125-3 along the NO branch from block 122-2 for new properties and properties that were not proven or disproven during formal verification session 110 arrive, and control is passed to block 125-3 along the NO branch from block 125-2 for unverified previously proven/disproven properties that remain unproven after path-influenced search processing. In each of these cases, a full "from scratch" search process is required for the unproven property using the same selected formal verification search strategy that was used during session 110. For brevity, the description provided above with reference to FIG. 2 is incorporated here to describe the search process implemented in block 125-3. Once the property is either proven or disproven block 125-3, or if the search process is suspended due to a preset time limit, control passes to block 125-4, which either passes control to block 126 along the YES branch for storage of a proof artifact or a counterexample trace generated by the formal verification solver, or passes control to block 128.

Referring to block 128 at the lower portion of FIG. 3, after a search process is completed for each selected property, the formal verification solver passes control back to block 121 when it determines that one or more properties remain in property set PS2 that have not been subject to search processing during formal verification session 120. The loop formed by blocks 121 to 128 is then repeated until all properties in property set PS2 have been processed (NO branch from block 128), at which point the formal verification solver generates and transmits formal verification results 129 to the user, thereby ending session 120.

Figure 5:
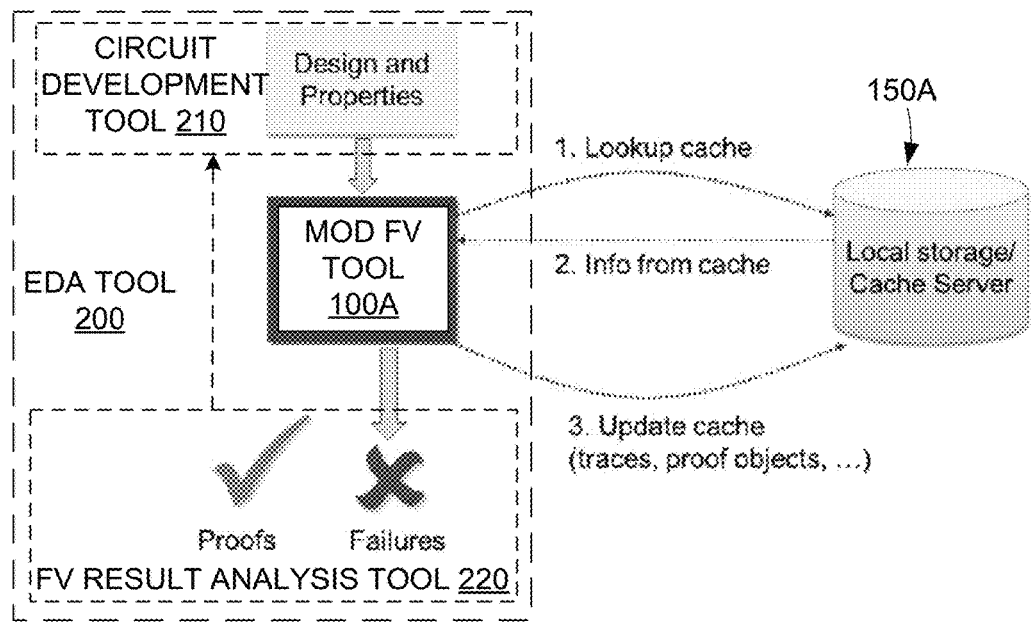
FIG. 5 is a simplified block-flow diagram depicting an EDA tool configuration that implements the modified formal verification process according to an embodiment of the present invention.

FIG. 5 is a simplified block-flow diagram depicting modified formal verification tool (MOD FV TOOL) 100A implemented as part of an EDA tool 200 according to an embodiment of the present invention. In one embodiment, modified formal verification tool 100A is configured to perform the modified formal verification methodology set forth above. EDA tool 200 includes additional software tools configured to work in cooperation with modified formal verification tool 100A to facilitate the development of a core circuit design. In one embodiment, these additional software tools include a circuit development tool 210 configured to allow a user to enter and modify the core circuit design and to enter associated properties for periodic submission to modified formal verification tool 100A, and a formal verification results analysis tool 220 configured to process results generated by modified formal verification tool 100A after each formal verification session, and to assist the user in modifying the core circuit design until a final circuit design is ready for fabrication. Note that circuit development tool 210 and results analysis tool 220 may be implemented using existing software tools known in the art, and that the key difference between EDA tool 200 and a conventional EDA tool is the utilization of local storage or cache memory 150A to store and receive search path information generated and processed by modified formal verification tool 100A, as indicated by the dashed line arrows in FIG. 5 and described above.

Figure 6:
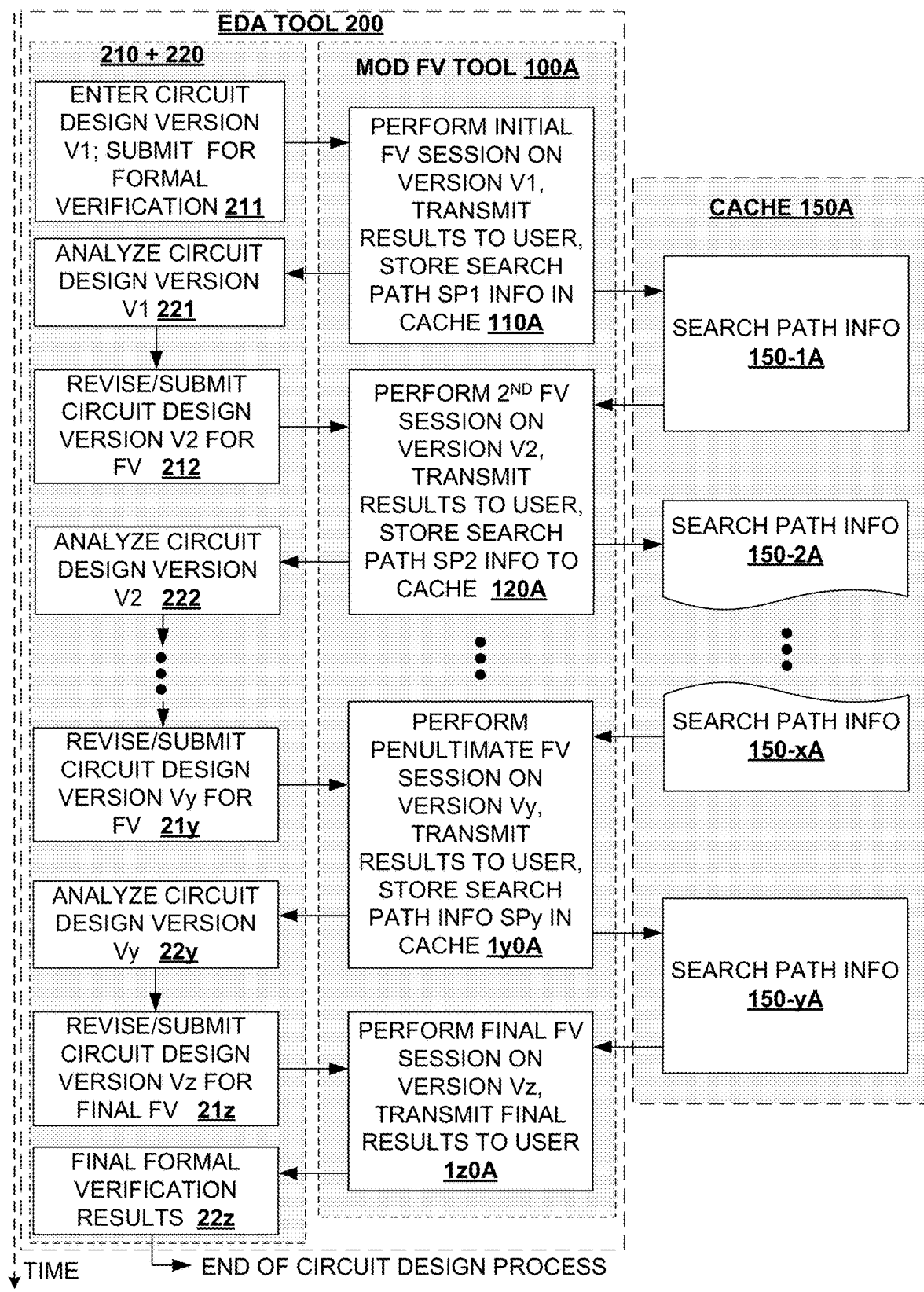
FIG. 6 is a simplified flow diagram depicting multiple sequential formal verification sessions performed using the EDA tool configuration of FIG. 5.

FIG. 6 depicts an exemplary series of processes performed by EDA tool 200 (shown in FIG. 5) during the development phase of a core circuit design. The timing sequence of the depicted processes is are generally depicted using a vertical orientation, with exemplary sequential actions performed by circuit development tool 210 and results analysis tool 220 are vertically arranged in the left-side column of FIG. 6, exemplary sequential actions performed by modified formal verification tool 100A are vertically arranged in the central column of FIG. 6, and sequential contents of cache memory 150 are depicted in the right-side column of FIG. 6. Referring to the upper left corner of FIG. 6, the development of a core circuit design begins by entry of initial circuit design version V1 and a first property set by a user using circuit development tool 210 and then submission of version V1 for formal verification (block 211). Modified formal verification tool 100A performs the modified formal verification process and stores search path information 150-1A in cache 150A described above, and transmits results of the formal verification process to results analysis tool 220 (block 110A). The user then analyzes the formal verification results for version V1 (block 221), and then revises the core circuit design to produce a second version V2, which is then submitted along with a corresponding property set to modified formal verification tool 100A (block 212), whereby a second formal verification session is performed using stored search path information 150-1A, revised search path information 150-2A is generated and stored in cache 150A, and results for version V2 are transmitted to results analysis tool 220 (block 120A), and then the user analyzes the results for version V2 (block 222) and enters further revisions to the core circuit design. The sequence described above is repeated any number of times (indicated by the vertical three-dot pattern in each column of FIG. 6) until a penultimate version Vy is submitted (block 21y), a penultimate formal verification session is performed using search path information 150-xA (generated during the previously executed formal verification session), revised search path information 150-yA is generated and stored in cache 150A, and results for penultimate version Vy are transmitted to results analysis tool 220 (block 1y0A). The user then analyzes the penultimate results (block 22y), enters final revisions to the core circuit design, and submits the final circuit design version Vz for final formal verification. Note that final verification process (block 1z0A) utilizes search path information 150-yA to verify all previously proven properties, and returns final results (typically indicating that all properties are true) reporting completion of the circuit design process (block 22z).

FIG. 6 demonstrates several characteristics of the present invention as applied to the appended claims. For example, although the appended claims refer to two formal verification sessions, FIG. 6 illustrates that the present invention applies to any two formal verification sessions utilized to formally verify any number of sequentially-generated versions of a core circuit design. That is, although it is well established that the present invention applies to initial formal verification session 110A and second formal verification session 120A (i.e., as described above with reference to FIG. 1), the present invention may also apply to any two sequentially performed formal verification sessions (e.g., penultimate formal verification session 1y0A and final formal verification session 1z0A). Moreover, because search path information generated by way of a full "from scratch" search process may be performed for a given property during any session, and because this search path information is effectively retained in cache memory so long as the given property is verified as proven/disproven with respect to each successive circuit design version, the present invention may also apply to any number of sequentially executed sessions, where the "from scratch" search process occurs in the earliest session and the search-path verification process occurs in the last session of the sequentially executed sessions. Finally, as indicated in the lower right corner of FIG. 6, the modified formal verification process may be further modified to omit the generation of search path information for final circuit design version Vz during final verification session 1z0A.

Figure 7:
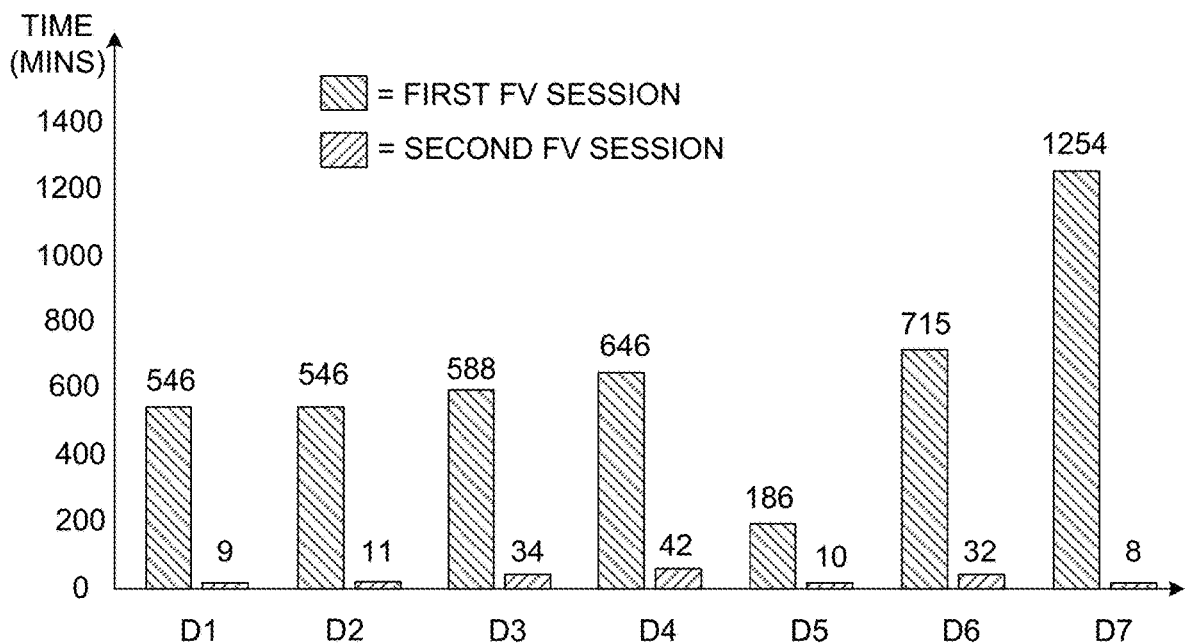
FIG. 7 includes a series of bar graphs depicting experimentally generated data showing processing time reductions for sequential formal verification sessions applied to exemplary circuit designs.

As set forth above, the modified formal verification methodology of the present invention achieves substantially lower total formal verification processing time by way of exploiting the internal characteristics of conventional formal verification tools to generate search path information that may be used to quickly verify previously proven/disproven properties. By implementing the search-path verification process using previously generated search path information on current circuit design version, the modified formal verification methodology is more robust that conventional solutions, and is applicable to both iterative design changes and property changes. As indicated in FIG. 7, when utilized to formally verify a set of industrial circuit designs Dl to D7 during successive formal verification sessions, the modified formal verification methodology achieved a two-times to one-hundred-times reduction in processing time. The depicted results demonstrate the value of re-using results from previous computations (i.e., by way of storing search path information), even after incremental set up changes to either RTL or netlist design, properties or environment. By saving and reusing search path information from previous sessions (after validation), the methodology of the present invention handles design changes at ease, which cannot be achieved by traditional caching techniques. Moreover, the modified formal verification methodology requires a relatively small amount of data storage, particularly when the search path information generated for each proven/disproven property is stored in a compressed form. For example, the search path information for a typical core circuit design may be stored using as little as a few megabytes of memory, as compared to the gigabytes of memory required by traditional caching approaches for the same core circuit design). Accordingly, the present invention provides significant savings in terms of data storage requirements, and also in terms of computing resources by way of substantially reducing the total processing time required to perform multiple formal verification sessions during the development of a core circuit design.

Technology Specific EDA System/Workflow Explanation

Figure 8:
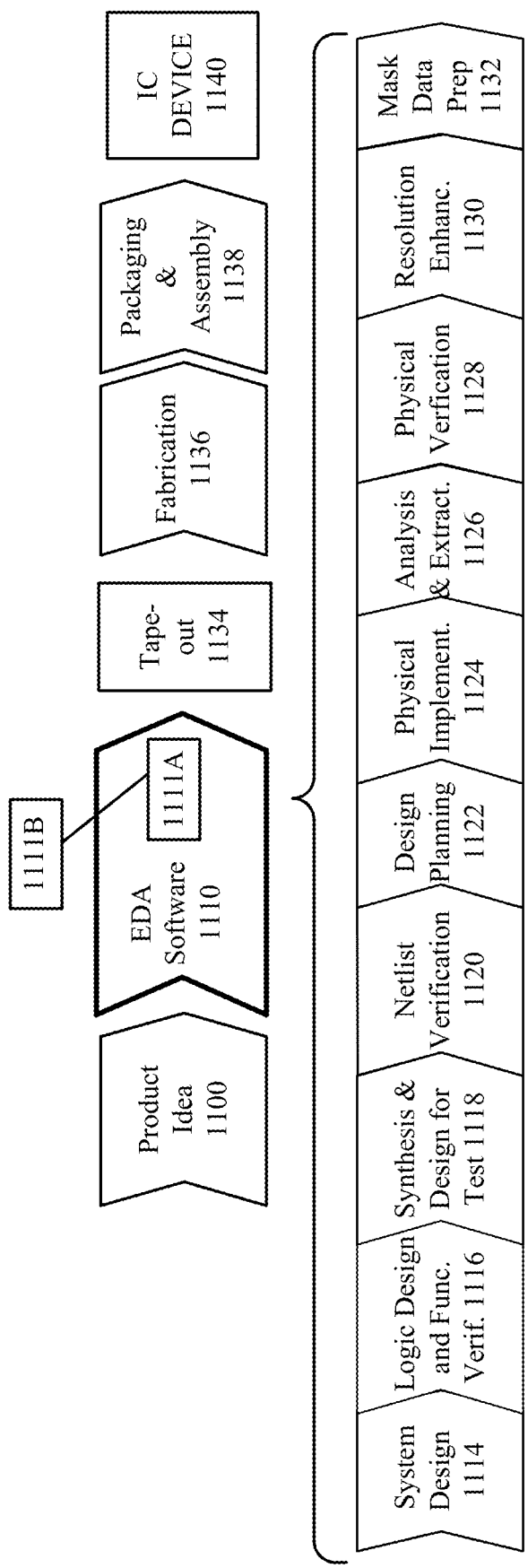
FIG. 8 is a flowchart illustrating various operations in the design and fabrication of an integrated circuit in accordance with an embodiment of the present disclosure.

FIG. 8 illustrates various processes performed in the design and fabrication of IC devices using software tools with a computer to transform data and instructions that represent the associated IC devices. These processes start with the generation of a product idea (1100) with information supplied by one or more circuit designers. The product idea is realized as the evolving circuit design, which is described above with reference to FIG. 7, during the circuit design process performed by the circuit designer(s) using EDA software tools (1110). One or more steps of the EDA software design process performed by EDA software tools (1110) is implemented using a computer-readable medium 1111A that is read by a computer 1111B. EDA software tools may also be signified herein using the singular "EDA software tool", as EDA software, or as a design tool. When a circuit design is finalized, it is typically taped-out (1134), and then multiple ICs, each being a physical implementation of the final circuit design, are fabricated on a semiconductor wafer (1136) using a selected technology node. The semiconductor wafer is then diced into individual chips, with each chip including one of the ICs, and then the chips are packaged and assembled using corresponding processes (1138), resulting in finished IC device 1140.

Note that the design process that uses EDA software tools (1112) includes operations 1114-1132, which are described below. This design flow description is for illustration purposes only and is not meant to limit the present disclosure. For example, an actual circuit design may require a circuit designer to perform the design operations in a different sequence than the sequence described herein.

During system design (1114), a circuit designer describes the functionality to be performed by the manufactured IC device. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and Designware products. Cells or other descriptions including all relevant information pertaining to the two-part USB PHY configuration of the present invention are typically copied from a library accessible by way of the EDA software tool, and inserted into a circuit design during the system design process.

Then, during logic design and functional verification (1116), VHDL or Verilog code for modules in the circuit is written and the design is checked for functional accuracy. More specifically, the design is checked to ensure that it produces the correct outputs. The VHDL or Verilog code is software comprising optimized readable program instructions adapted for the efficient description of a logic design. Exemplary EDA software products from Synopsys, Inc. of Mountain View, Calif. that can be used at this stage include: VCS, Vera, Designware, Magellan, Formality, ESP and Leda products.

Next, during synthesis and design for test (1118), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products. In one embodiment, the modified formal verification process described herein may be utilized to formally verify netlists generated from early circuit design versions generated during synthesis and design.

Moreover, during netlist verification (1120), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products. In one embodiment, the modified formal verification process described herein may be utilized to formally verify netlists generated from associated circuit design versions during netlist verification.

Furthermore, during design planning (1122), an overall floor plan for the integrated circuit is constructed and analyzed for timing and top-level routing. Exemplary EDA software products from Synopsys, Inc. of Mountain View, Calif. that can be used at this stage include: Astro and IC Compiler products. In one embodiment, the modified formal verification process described herein may be utilized to formally verify the circuit design versions generated during design planning.

Additionally, during physical implementation (1124), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products. In one embodiment, the modified formal verification process described herein may be utilized to formally verify the circuit design versions generated during design planning.

Then, during analysis and extraction (1126), the circuit function is verified at a transistor level, which permits refinement of the logic design. Exemplary EDA software products from Synopsys, Inc. of Mountain View, Calif. that can be used at this stage include: Astrorail, Primerail, Primetime, and Star RC/XT products. In one embodiment, the modified formal verification process described herein may be utilized to formally verify transistor-level circuit design versions generated during analysis and extraction.

Next, during physical verification (1128), the design is checked to ensure correctness for manufacturing issues, electrical issues, lithographic issues, and circuitry. Exemplary EDA software products from Synopsys, Inc. of Mountain View, Calif. that can be used at this stage include the Hercules product.

Moreover, during resolution enhancement (1130), geometric manipulations of the layout are performed to improve manufacturability of the design. Exemplary EDA software products from Synopsys, Inc. of Mountain View, Calif. that can be used at this stage include: Proteus, Proteus, and PSMGED products.

Additionally, during mask-data preparation (1132), the 'tape-out' data for production of masks to produce finished integrated circuits is provided. Exemplary EDA software products from Synopsys, Inc. of Mountain View, Calif. that can be used at this stage include the Cats. family of products.

For all of the above mentioned integrated circuit design tools, similar tools from other EDA vendors, such as Cadence and Mentor Graphics can be used as an alternative. Additionally, similarly non-commercial tools available from universities can be used.

Embodiments of the present disclosure can be used during one or more of the above-described stages. Specifically, some embodiments of the present disclosure can be used in EDA software 1112.

A storage subsystem is preferably used to store the basic programming and data constructs that provide the functionality of some or all of the EDA tools described herein, and tools applied for development of cells for the library and for physical and logical design using the library. These software modules are generally executed by one or more processors in a manner known to those of ordinary skill in the art.

Hardware/Software Equivalence

Certain innovations, embodiments and/or examples described herein comprise and/or use a processor. As used herein, the term "processor" signifies a tangible information processing device that physically transforms information, for example, data. As defined herein, "data" signifies information that can be in the form of an electrical, magnetic, or optical signal that is capable of being stored, accessed, transferred, combined, compared, or otherwise manipulated by an information processing device.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For information structured in binary form, any processor that can transform the information using the AND, OR and NOT logical operations (and their derivatives, such as the NAND, NOR, and XOR operations) can transform the information using any function of Boolean logic. A processor such as a neural network processor can also transform information non-digitally. There is no scientific evidence that any of these processors are processing, storing and retrieving information, in any manner or form equivalent to the bioelectric circuitry of the human brain.

As used herein, the term "module" signifies a tangible information processing device that typically is limited in size and/or complexity. For example, one or more methods or procedures in a computer program can be referred to as a module. A module can also refer to a small network of digital logic devices, in which the logic devices often may be interconnected to form a network. In many cases, methods and procedures in a computer program written in a specialized language, such as System C, can be used to generate a network of digital logic devices that process information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Altera), Random Access Memories (RAMS) or microprocessors. A module is configured to process information, typically using a sequence of operations to transform the information (or in the case of ROMs and RAMS, transforming information by using the input information as an address for memory that stores output information), to perform aspects of the present innovations, embodiments and/or examples of the invention.

Modules that are temporarily configured need not be configured at any one instance in time. For example, an information processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term "algorithm" signifies a sequence or set of operations or instructions that a module can use to transform information to achieve a result. A module can comprise one or more algorithms. As used herein, the term "computer" includes an information processor that can perform certain operations such as (but not limited to) the AND, OR and NOT logical operations, with the addition of memory (for example, memory based on flip-flops using the NOT-AND or NOT-OR operation). Such a digital computer is said to be Turing-complete or computationally universal. A computer, whether or not it is a digital computer, typically comprises many modules.

As used herein, the term "software" or "program" signifies one or more algorithms and data structures that configure an information processing device for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of instruction and data that configure the information processing device to achieve a specific result, for example, to perform word processing operations, or to encrypt a set of data.

As used herein, the term "programming language" signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from an information storage device. The computer typically has a device for reading storage media that is used to transport the software, or has an interface device that receives the software over a network.

Technology Specific General Computer Explanation

FIGS. 9A, 9B and 9C are simplified block diagrams of a computer system suitable for generating and formally verifying circuit designs using the modified formal verification process of the present invention. Computer system 3110 typically includes at least one computer or processor 3114 which communicates with a number of peripheral devices via bus subsystem 3112. These peripheral devices may include a storage subsystem 3124, comprising a memory subsystem 3126 and a file storage subsystem 3128, user interface input devices 3122, user interface output devices 3120, and a network interface subsystem 3116. The input and output devices allow user interaction with computer system 3110.

The computer system may be a server computer, a client computer, a workstation, a mainframe, a personal computer (PC), a tablet PC, a set-top box (STB), a personal digital assistant (PDA), a cellular telephone, a smartphone, a web appliance, a television, a network router, switch or bridge, or any data processing machine capable of executing instructions (sequential or otherwise) that specify actions to be taken by that machine. Innovations, embodiments and/or examples of the claimed inventions are neither limited to conventional computer applications nor the programmable apparatus that run them. To illustrate, the innovations, embodiments and/or examples of the claimed inventions can include an optical computer, quantum computer, analog computer, or the like. Aspects of the present invention are well suited to multi-processor or multi-core systems and may use or be implemented in distributed or remote systems. Processor here is used in the broadest sense to include singular processors and multi-core or multi-processor arrays, including graphic processing units, digital signal processors, digital processors and combinations of these elements. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 3110 depicted in FIG. 9A is intended only as a specific example for purposes of illustrating the preferred embodiments. Many other configurations of computer system 3110 are possible having more or less components than the computer system depicted in FIG. 9A.

Network interface subsystem 3116 provides an interface to outside networks, including an interface to communication network 3118, and is coupled via communication network 3118 to corresponding interface devices in other computer systems or machines. Communication network 3118 may comprise many interconnected computer systems, machines and communication links. These communication links may be wireline links, optical links, wireless links, or any other devices for communication of information. Communication network 3118 can be any suitable computer network, for example the Internet.

User interface input devices 3122 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 3110 or onto communication network 3118. User interface output devices 3120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide nonvisual display such as via audio output devices. In general, use of the term "output device" is intended to include all possible types of devices and ways to output information from computer system 3110 to the user or to another machine or computer system.

Memory subsystem 3126 typically includes a number of memories including a main random access memory (RAM) 3130 for storage of instructions and data during program execution and a read only memory (ROM) 3132 in which fixed instructions are stored. In one embodiment, the cache memory described above that serves to store search path information during execution of the modified formal verification process is included in RAM 3130. File storage subsystem 3128 provides persistent storage for program and data files, and may include a hard disk drive, a floppy disk drive along with associated removable media, a CD-ROM drive, an optical drive, or removable media cartridges. In one embodiment search path information is transferred from cache memory to file storage subsystem 3128 during time periods between two sequential formal verification sessions. The databases and modules implementing the functionality of certain embodiments may be stored by file storage subsystem 3128. Bus subsystem 3112 provides a device for letting the various components and subsystems of computer system 3110 communicate with each other as intended. Although bus subsystem 3112 is shown schematically as a single bus, alternative embodiments of the bus subsystem may use multiple busses.

When configured to execute an EDA software tool including the modified formal verification process described herein, computer system 3110 depicted in FIG. 9A represents an electronic structure suitable for creating a circuit design. FIG. 9B shows a memory 3140 such as a non-transitory, computer readable data storage medium associated with file storage subsystem 3128, and/or with network interface subsystem 3116, and includes a data structure 3180 specifying a circuit design describing an integrated circuit. The memory 3140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light). FIG. 9C is a block representing an IC 3190 designed and fabricated in accordance with the processes described above, where circuit 3190 is fabricated in accordance with the circuit design of data structure 3180 (see FIG. 9B).

The foregoing Detailed Description signifies in isolation individual features, structures or characteristics described herein and any combination of two or more such features, structures or characteristics, to the extent that such features, structures or characteristics or combinations thereof are based on the present specification as a whole in light of the knowledge of a person skilled in the art, irrespective of whether such features, structures or characteristics, or combinations thereof, solve any problems disclosed herein, and without limitation to the scope of the claims. When an embodiment of a claimed invention comprises a particular feature, structure, or characteristic, it is within the knowledge of a person skilled in the art to use such feature, structure, or characteristic in connection with other embodiments whether or not explicitly described.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein were chosen and described to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

The invention claimed is:

1. In an electronic design automation (EDA) tool in a computer, a method for formally verifying multiple sequentially-generated versions of a circuit design including performing a separate formal verification session for each said circuit design version using an associated property set including multiple properties, wherein each said formal verification session involves one of (a) proving that each said property is true with respect to an associated said circuit design version, and (b) disproving each said property with respect to said associated circuit design version, the method comprising:

during a first said formal verification session involving a first circuit design version and a first associated property set including a first property, applying first search operations to said first circuit design version according to a formal verification search strategy to prove/disprove said first property, and storing first search path information that is generated in accordance with said applied first search operations, wherein said first search path information includes a sequential set of said first search operations applied to said first circuit design version during said first search operations that achieved one of a first proof object that proves said first property, and a first counterexample that disproves said first property; and during a second said formal verification session, which is performed after the first formal verification session and involves a second circuit design version and a second associated property set including said first property, performing a search-path verification process including utilizing at least a portion of said stored first search path information to determine whether said first property is proven/disproven in said second circuit design version.

2. The EDA tool of claim 1, wherein applying said first search operations to said first circuit design version comprises applying a first reset state and one or more first formal verification engines to said first circuit design version until said first counterexample is achieved, and wherein storing said first search path information comprises storing a counterexample trace including said one or more first formal verification engines that were applied to said first circuit design version in said first reset state to achieve said first counterexample.

3. The EDA tool of claim 1, wherein applying said first search operations to said first circuit design version comprises applying a first reset state and one or more first formal verification engines to said first circuit design version until said first proof object is achieved, and wherein storing said first search path information comprises storing a proof artifact including said one or more first formal verification engines applied to said first circuit design version in said first reset state to achieve said first proof object.

4. The EDA tool of claim 1, wherein storing said first search path information during said first formal verification session comprises writing said first search path information into cache memory, and wherein performing said search-path verification process comprises reading said first search path information from said cache memory, and then applying said first search path information to said second circuit design version.

5. The EDA tool of claim 1, wherein performing said search-path verification process comprises applying a second reset state and said first search path information to said second circuit design version, whereby said first property is verified as being proven when said first search path information achieves said associated first proof object in said second circuit design version, and said first property is verified as being disproven when said first search path information achieves said associated first counterexample in said second circuit design version.

6. The EDA tool of claim 5, wherein, when said search-path verification process fails to verify that said first property is proven/disproven in said second circuit design version, said method further comprises:

generating second search path information that proves/disproves said first property by applying said second reset state and one or more second search operations to said second circuit design version; and storing said second search path information such that said second search path information replaces said first search path information.

7. The EDA tool of claim 6, wherein generating second search path information comprises performing a path-influenced search process utilizing a portion of said first search path information to establish an intermediate state, and then utilizing the formal verification search strategy to apply said one or more second search operations to said intermediate state in order to generate said second search path information.

8. The EDA tool of claim 7, wherein performing said path-influenced search process comprises truncating one or more of said first search operations from said first search path information, applying said truncated first search path information to said second circuit design version to establish an associated intermediate state, and then applying said one or more second search operations to said associated intermediate state.

9. The EDA tool of claim 6, wherein generating second search path information comprises performing a full search process using said formal verification search strategy to apply said second reset state and said one or more second search operations to said second circuit design version in order to generate said second search path information.

10. The EDA tool of claim 9, further comprising performing a path-influenced search process after performing said search-path verification process and before performing said full search process.

11. An apparatus, comprising: a processor; and a non-transitory computer-readable storage medium storing instructions that, when executed by the processor, cause the processor to perform a method for formally verifying multiple sequentially-generated versions of a circuit design including performing a separate formal verification session for each said circuit design version using an associated property set including multiple properties, wherein each said formal verification session involves one of (a) proving that each said property is true with respect to an associated said circuit design version, and (b) disproving each said property with respect to said associated circuit design version, the method comprising:

during a first said formal verification session involving a first circuit design version and a first associated property set including a first property, applying first search operations to said first circuit design version according to a formal verification search strategy to prove/disprove said first property, and storing first search path information that is generated in accordance with said applied first search operations, wherein said first search path information includes a sequential set of said first search operations applied to said first circuit design version during said first search operations that achieved one of a first proof object that proves said first property, and a first counterexample that disproves said first property; and during a second said formal verification session, which is performed after the first formal verification session and involves a second circuit design version and a second associated property set including said first property, performing a search-path verification process including utilizing at least a portion of said stored first search path information to determine whether said first property is proven/disproven in said second circuit design version.

12. A computer implemented method for formally verifying multiple sequentially-generated versions of a circuit design including performing a separate formal verification session for each said circuit design version using an associated property set including multiple properties, wherein each said formal verification session involves one of (a) proving that each said property is true with respect to an associated said circuit design version, and (b) disproving each said property with respect to said associated circuit design version, the method comprising:

during a first said formal verification session involving a first circuit design version and a first associated property set including a first property, applying first search operations to said first circuit design version according to a formal verification search strategy to prove/disprove said first property, and storing first search path information that is generated in accordance with said applied first search operations, wherein said first search path information includes a first reset state and a sequential set of said first search operations applied to said first circuit design version during said first search operations that achieved one of a first proof object that proves said first property, and a first counterexample that disproves said first property; and during a second said formal verification session, which is performed after the first formal verification session and involves a second circuit design version and a second associated property set including said first property, performing a search-path verification process including utilizing at least a portion of said stored first search path information to determine whether said first property is proven/disproven in said second circuit design version.

13. The method of claim 12,
wherein applying said first search operations to said first circuit design version comprises applying a first reset state and one or more first formal verification engines to said first circuit design version until said first counterexample is achieved, and
wherein storing said first search path information comprises storing a counterexample trace including said one or more first formal verification engines that were applied to said first circuit design version to achieve said first counterexample.

14. The method of claim 12,
wherein applying said first search operations to said first circuit design version comprises applying a first reset state and one or more first formal verification engines to said first circuit design version until said first proof artifact is achieved, and
wherein storing said first search path information comprises storing a proof artifact including said one or more first formal verification engines applied to said first circuit design version to achieve said first proof object.

15. The method of claim 12,
wherein storing said first search path information during said first formal verification session comprises writing said first search path information into cache memory, and wherein performing said search-path verification process comprises reading said first search path information from said cache memory, and then applying said first search path information to said second circuit design version.

16. The method of claim 12, wherein performing said search-path verification process comprises applying a second reset state and said first search path information to said second circuit design version, whereby said first property is verified as being proven when said first search path information achieves said associated first proof object in said second circuit design version, and said first property is verified as being disproven when said first search path information achieves said associated first counterexample in said second circuit design version.

17. The method of claim 16, wherein, when said search-path verification process fails to verify that said first property is proven/disproven in said second circuit design version, said method further comprises:

generating second search path information that proves/disproves said first property by applying said second reset state and one or more second search operations to said second circuit design version;

storing said second search path information such that said second search path information replaces said first search path information.

18. The method of claim 17, wherein generating second search path information comprises performing a path-influenced search process utilizing a portion of said first search path information to establish an intermediate state, and then utilizing the formal verification search strategy to apply said one or more second search operations to said intermediate state in order to generate said second search path information.

19. The method of claim 18, wherein performing said path-influenced search process comprises truncating one or more of said first search operations from said first search path information, applying said truncated first search path information to said second circuit design version to establish an associated intermediate state, and then applying said one or more second search operations to said associated intermediate state.

20. The method of claim 17, wherein generating second search path information comprises performing a full search process using said formal verification search strategy to apply said second reset state and said one or more second search operations to said second circuit design version in order to generate said second search path information.

* * * * *